US012795921B2

(12) United States Patent
Son et al.

(10) Patent No.: US 12,795,921 B2
(45) Date of Patent: Nov. 10, 2026

(54) VERTICAL NON-VOLATILE MEMORY DEVICE INCLUDING CONTACT GATE STACK AND CONTACT ELECTRODE

(71) Applicant: Samsung Electronics Co., Ltd., Suwon-si (KR)

(72) Inventors: Yonghoon Son, Yongin-si (KR); Sukkang Sung, Seongnam-si (KR); Sangdon Lee, Hwaseong-si (KR); Euntaek Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1062 days.

(21) Appl. No.: 17/955,696

(22) Filed: Sep. 29, 2022

(65) Prior Publication Data

US 2023/0109996 A1 Apr. 13, 2023

(30) Foreign Application Priority Data

Oct. 8, 2021 (KR) ........................ 10-2021-0134435

(51) Int. Cl.
*H01L 27/1157* (2017.01)
*H01L 23/522* (2006.01)
(Continued)

(52) U.S. Cl.
CPC ............. *H10B 43/27* (2023.02); *H10B 43/40* (2023.02); *H10W 20/20* (2026.01)

(58) Field of Classification Search
CPC ........ H10B 43/27; H10B 43/10; H10B 41/27; H10B 43/40; H10B 43/50; H10B 41/10;
(Continued)

(56) References Cited

U.S. PATENT DOCUMENTS 8,765,598 B2 7/2014 Smith et al.
9,960,181 B1 5/2018 Cui et al.
(Continued)

FOREIGN PATENT DOCUMENTS

KR 10-2017-0139390 A 12/2017
KR 10-2021-0039183 A 4/2021
KR 10-2021-0107390 A 9/2021

OTHER PUBLICATIONS

Office Action in Korean Appln. No. 10-2021-0134435, mailed on Jun. 20, 2025, 16 pages (with English translation).
(Continued)

*Primary Examiner* — Leonard Chang
*Assistant Examiner* — Tsz K Chiu
(74) *Attorney, Agent, or Firm* — Fish & Richardson P.C.

(57) ABSTRACT

A vertical non-volatile memory device includes, a substrate, a contact gate stack structure including a plurality of gate lines stacked in a vertical direction on the substrate, the vertical direction being perpendicular to a surface of the substrate, a plurality of insulating layers between the gate lines, a plurality of separation insulating layers in contact with a protruding end of each of the plurality of gate lines, respectively, in a horizontal direction at both sides of a contact hole, wherein the contact hole extends in the vertical direction in the contact gate stack structure so that the protruding ends of the plurality of gate lines protrude from an inner wall of the contact hole, the horizontal direction being horizontal to the surface of the substrate, and a contact electrode at the contact hole and electrically connected to an uppermost gate line among the plurality of gate lines.

20 Claims, 20 Drawing Sheets

(51) Int. Cl.

| | |
|---|---|
| ***H01L 27/11524*** | (2017.01) |
| ***H01L 27/11582*** | (2017.01) |
| ***H10B 43/27*** | (2023.01) |
| ***H10B 43/40*** | (2023.01) |
| ***H10W 20/20*** | (2026.01) |

(58) Field of Classification Search
CPC .... H10B 43/35; H10B 41/35; H10B 12/0335; H10B 41/40; H10B 10/12; H10B 12/485; H10B 12/315; H10B 41/50; H10B 12/50; H10B 12/09; H10B 12/482; H10B 12/488; H10B 51/50; H10B 80/00; H10B 12/033; H10B 12/34; H10B 12/05; H10B 12/053; H10B 12/31; H10B 12/36; H10B 41/30; H10B 41/41; H10B 43/20; H10B 43/30; H10B 12/00; H10W 20/20; H10W 20/42; H10W 20/056; H10W 20/083; H10W 20/435; H10W 20/076; H10W 20/081; H10W 20/069; H10W 20/089; H10W 20/43; H10W 20/023; H10W 20/0698; H10W 20/075; H10W 20/47
See application file for complete search history.

(56) References Cited

U.S. PATENT DOCUMENTS

| | | | | |
|---|---|---|---|---|
| 9,991,271 | B2 | 6/2018 | Kang et al. | |
| 10,283,566 | B2 | 5/2019 | Sel et al. | |
| 10,438,963 | B2 * | 10/2019 | Kim | H10B 43/27 |
| 10,490,569 | B2 | 11/2019 | Mushiga et al. | |
| 10,685,975 | B2 * | 6/2020 | Baek | H01L 21/76895 |
| 10,727,248 | B2 * | 7/2020 | Kaminaga | H10B 43/40 |
| 11,107,826 | B2 * | 8/2021 | Lee | G11C 16/0483 |
| 11,296,021 | B2 | 4/2022 | Lee | |
| 11,462,553 | B2 | 10/2022 | Kang et al. | |
| 2017/0358590 | A1 * | 12/2017 | Kang | H10B 41/27 |
| 2019/0280002 | A1 | 9/2019 | Kai et al. | |
| 2020/0043830 | A1 * | 2/2020 | Baek | H10B 43/40 |
| 2020/0105783 | A1 * | 4/2020 | Baek | H01L 21/76897 |
| 2020/0402906 | A1 * | 12/2020 | Lim | H10B 43/10 |
| 2021/0082941 | A1 | 3/2021 | Son et al. | |
| 2021/0118902 | A1 | 4/2021 | Kanamori et al. | |

OTHER PUBLICATIONS

Notice of Allowance in Korean Appln. No. 10-2021-0134435, mailed on Jan. 21, 2026, 6 pages (with English translation).

* cited by examiner

VERTICAL NON-VOLATILE MEMORY DEVICE INCLUDING CONTACT GATE STACK AND CONTACT ELECTRODE

CROSS-REFERENCE TO RELATED APPLICATION

This application is based on and claims priority under 35 U.S.C. § 119 to Korean Patent Application No. 10-2021-0134435, filed on Oct. 8, 2021, in the Korean Intellectual Property Office, the disclosure of which is incorporated by reference herein in its entirety.

BACKGROUND

The inventive concepts relate to a non-volatile memory device, and more particularly, to a vertical non-volatile memory device.

To improve the degree of integration of a non-volatile memory device, cell transistors may be vertically stacked to improve the degree of integration. In the case of a NAND flash memory device among non-volatile memory devices, because one memory cell is formed of one transistor, the degree of integration may be improved by vertically stacking the memory cells.

SUMMARY

The inventive concepts provide a vertical non-volatile memory device having contact electrodes easily formed in a connection area electrically connected to a memory cell area.

According to some example embodiments of the inventive concepts, there is provided a vertical non-volatile memory device including a substrate, a contact gate stack structure including a plurality of gate lines stacked in a vertical direction on the substrate, the vertical direction being perpendicular to a surface of the substrate, a plurality of insulating layers between the gate lines, a plurality of separation insulating layers in contact with a protruding end of each of the plurality of gate lines, respectively, in a horizontal direction at both sides of a contact hole, wherein the contact hole extends in the vertical direction in the contact gate stack structure so that the protruding ends of the plurality of gate lines protrude from an inner wall of the contact hole, the horizontal direction being horizontal to the surface of the substrate, and a contact electrode at the contact hole and electrically connected to an uppermost gate line among the plurality of gate lines.

According to some example embodiments of the inventive concepts, there is provided a vertical non-volatile memory device including a memory cell area including memory cells on a substrate, and a connection area at one side of the memory cell area in a horizontal direction and electrically connected to the memory cell area, the connection area including a contact gate stack structure including a plurality of gate lines stacked in a vertical direction on the substrate and a plurality of insulating layers between the gate lines, the vertical direction being perpendicular to the surface of the substrate, a plurality of separation insulating layers in contact with a protruding end of each of the plurality of gate lines, respectively, in the horizontal direction at both sides of a contact hole, wherein the contact hole extends in the vertical direction in the contact gate stack structure so that the protruding ends of the plurality of gate lines protrude from an inner wall of the contact hole, a buried insulating layer buried in the contact hole, and a contact electrode on the buried insulating layer and the contact hole and electrically connected to an uppermost gate line among the plurality of gate lines.

According to some example embodiments of the inventive concepts, there is provided a vertical non-volatile memory device including a memory cell area including memory cells on a first substrate, a through electrode area at one side of the memory cell area in a horizontal direction and electrically connected to a peripheral circuit wiring layer of a second substrate below the first substrate, the horizontal direction being horizontal to a surface of the first substrate, and a contact area at one side of a through electrode in the horizontal direction and electrically connected to the memory cell area, wherein the through electrode area includes, an insulator stack structure including a through insulating layer penetrating the first substrate, a plurality of sacrificial films stacked in the vertical direction on the through insulating layer, and a plurality of first insulating layers between the sacrificial films, and a through hole extending in the vertical direction from the peripheral circuit wiring layer of the second substrate inside the insulator stack structure and exposing the peripheral circuit wiring layer and a through electrode buried in the through hole, wherein the contact area includes, a contact gate stack structure including a plurality of gate lines stacked in a vertical direction on the first substrate and a plurality of second insulating layers between the gate lines, the vertical direction being perpendicular to the surface of the first substrate, a plurality of separation insulating layers in contact with a protruding end of each of the plurality of gate lines, respectively, in the horizontal direction at both sides of a contact hole, wherein the contact hole extends in the vertical direction in the contact gate stack structure so that the protruding ends of the plurality of gate lines protrude from an inner wall of the contact hole, a buried insulating layer buried in the contact hole, and a contact electrode positioned on the buried insulating layer and the contact hole and electrically connected to an uppermost gate line among the plurality of gate lines.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
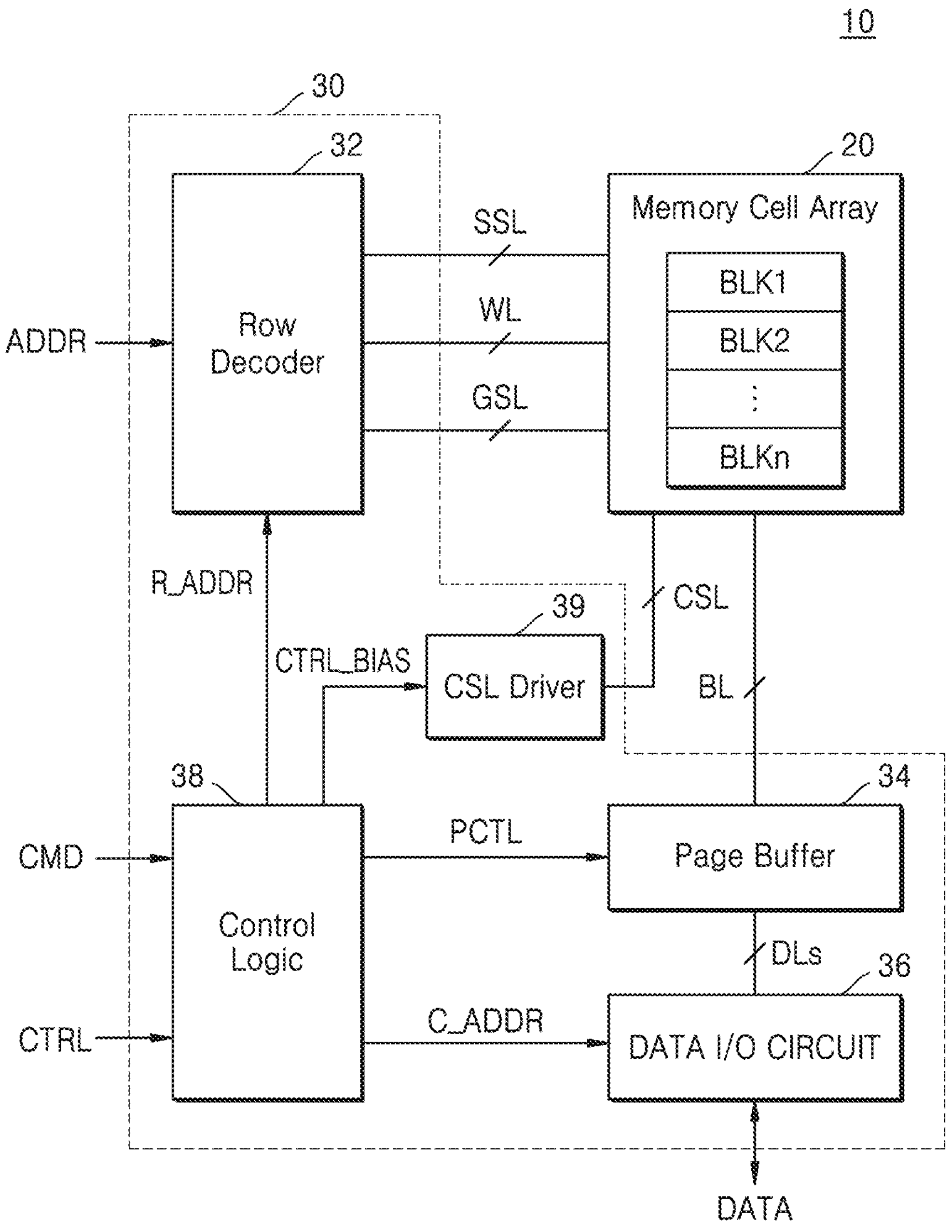
FIG. 1 is a block diagram of a vertical non-volatile memory device according to some example embodiments of the inventive concepts.

Hereinafter, some example embodiments of the inventive concepts will be described in detail with reference to the accompanying drawings. The same reference numerals are used for the same components in the drawings, and duplicate descriptions thereof are omitted.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

FIG. 1 is a block diagram of a vertical non-volatile memory device according to some example embodiments of the inventive concepts.

In particular, the vertical non-volatile memory device 10 has a characteristic in which stored data is continuously maintained even when power is not supplied thereto. The vertical non-volatile memory device 10 may be a vertical NAND flash memory device.

The vertical non-volatile memory device 10 may include a memory cell array 20 and/or a peripheral circuit 30. The memory cell array 20 includes a plurality of memory cell blocks BLK1, BLK2, . . . , BLKn (n is a positive integer). Each or one or more of the memory cell blocks BLK1, BLK2, . . . , BLKn (n is a positive integer) may include a plurality of memory cells. The memory cell blocks BLK1, BLK2, . . . , BLKn (n is a positive integer) may be connected to the peripheral circuit 30 through a bit line BL, a word line WL, a string select line SSL, and/or a ground select line GSL.

The peripheral circuit 30 may include a row decoder 32, a page buffer 34, a data input/output (I/O) circuit 36, a control logic 38, and/or a common source line (CSL) driver 39. Although not shown in FIG. 1, the peripheral circuit 30 may further include various circuits such as a voltage generating circuit for generating various voltages necessary or sufficient for the operation of the vertical non-volatile memory device 10, an error correction circuit for correcting an error in data read from the memory cell array 20, and/or an I/O interface.

The memory cell array 20 may be connected to the page buffer 34 through a bit line BL. The memory cell array 20 may be connected to the row decoder 32 through a word line WL, a string select line SSL, and/or a ground select line GSL. In the memory cell array 20, a plurality of memory cells included in each or one or more of the plurality of memory cell blocks BLK1, BLK2, . . . , BLKn (n is a positive integer) may be flash memory cells. The memory cell array 20 may include a three-dimensional memory cell array. The three-dimensional memory cell array may include a plurality of NAND strings. Each or one or more of the plurality of NAND strings may include a plurality of memory cells connected to vertically stacked word lines WL.

The peripheral circuit 30 may receive an address ADDR, a command CMD, and/or a control signal CTRL from the outside of the vertical non-volatile memory device 10, and may transmit/receive data DATA to/from a device outside the vertical non-volatile memory device 10.

The row decoder 32 may select at least one of the plurality of memory cell blocks BLK1, BLK2, . . . , BLKn (n is a positive integer) in response to an address ADDR from the outside, and may select a word line WL, a string select line SSL, and/or a ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense data DATA stored in the memory cell array 20. The page buffer 34 may operate according to a control signal PCTL provided from the control logic 38.

The data I/O circuit 36 may be connected to the page buffer 34 through a plurality of data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the vertical non-volatile memory device 10 in response to the control signal CTRL. For example, the control logic 38 may adjust the voltage level provided to the word line WL and the bit line BL when a memory operation such as a program operation or an erase operation is performed.

The CSL driver 39 may be connected to the memory cell array 20 through a common source line CSL. The CSL driver 39 may apply a common source voltage (e.g., a power supply voltage) and/or a ground voltage to the common source line CSL based on the control signal CTRL_BIAS of the control logic 38. In some example embodiments, the CSL driver 39 may be positioned under the memory cell array 20. The CSL driver 39 may be positioned to vertically overlap with at least a portion of the memory cell array 20.

Figure 2:
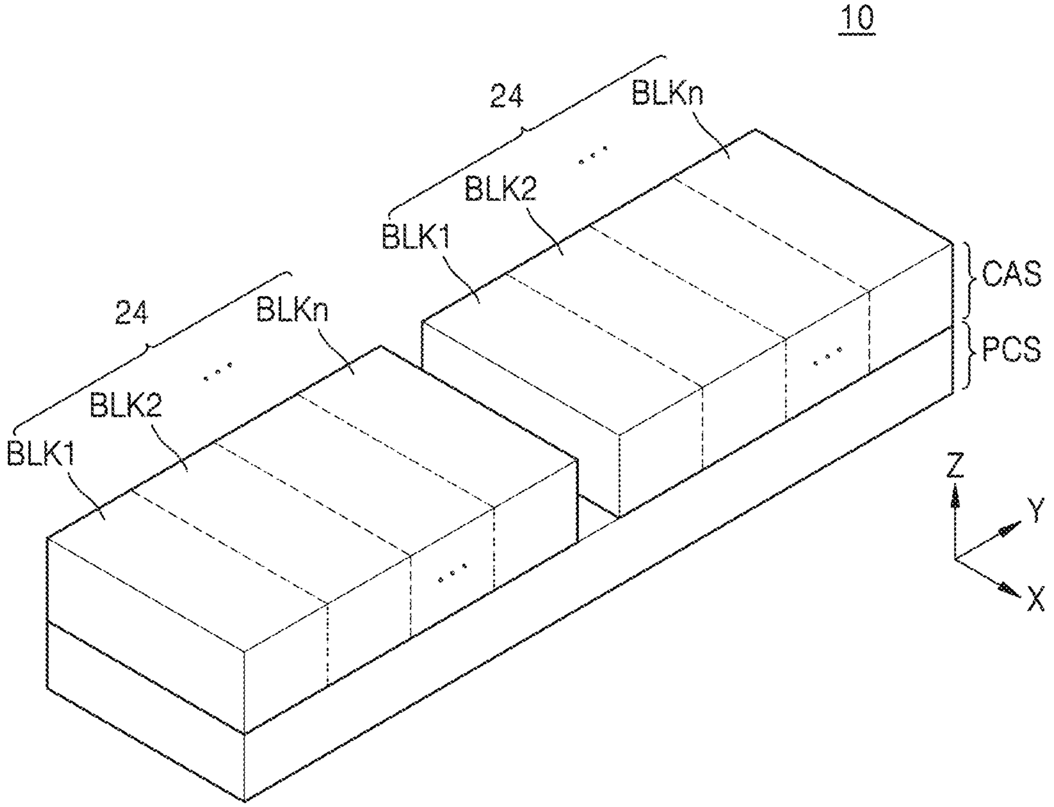
FIG. 2 is a schematic perspective view of a vertical non-volatile memory device according to some example embodiments of the inventive concepts.

FIG. 2 is a schematic perspective view of a vertical non-volatile memory device according to some example embodiments of the inventive concepts.

In particular, the vertical non-volatile memory device 10 may include a cell array structure CAS and a peripheral circuit structure PCS overlapping each other in a vertical direction (Z direction or a third direction). The horizontal direction (X direction or −X direction) may be referred to as a first direction. The horizontal direction (Y direction or −Y direction) may be referred to as a second direction.

The cell array structure CAS may include the memory cell array 20 of FIG. 1. The peripheral circuit structure PCS may include the peripheral circuit 30 of FIG. 1. The cell array structure CAS may include a plurality of tiles 24. Each or one or more of the tiles 24 may include a plurality of memory cell blocks BLK1, BLK2, . . . , BLKn (n is a positive integer). Each or one or more of the memory cell blocks BLK1, BLK2, . . . , BLKn (n is a positive integer) may include a plurality of memory cells arranged three-dimensionally.

Figure 3:
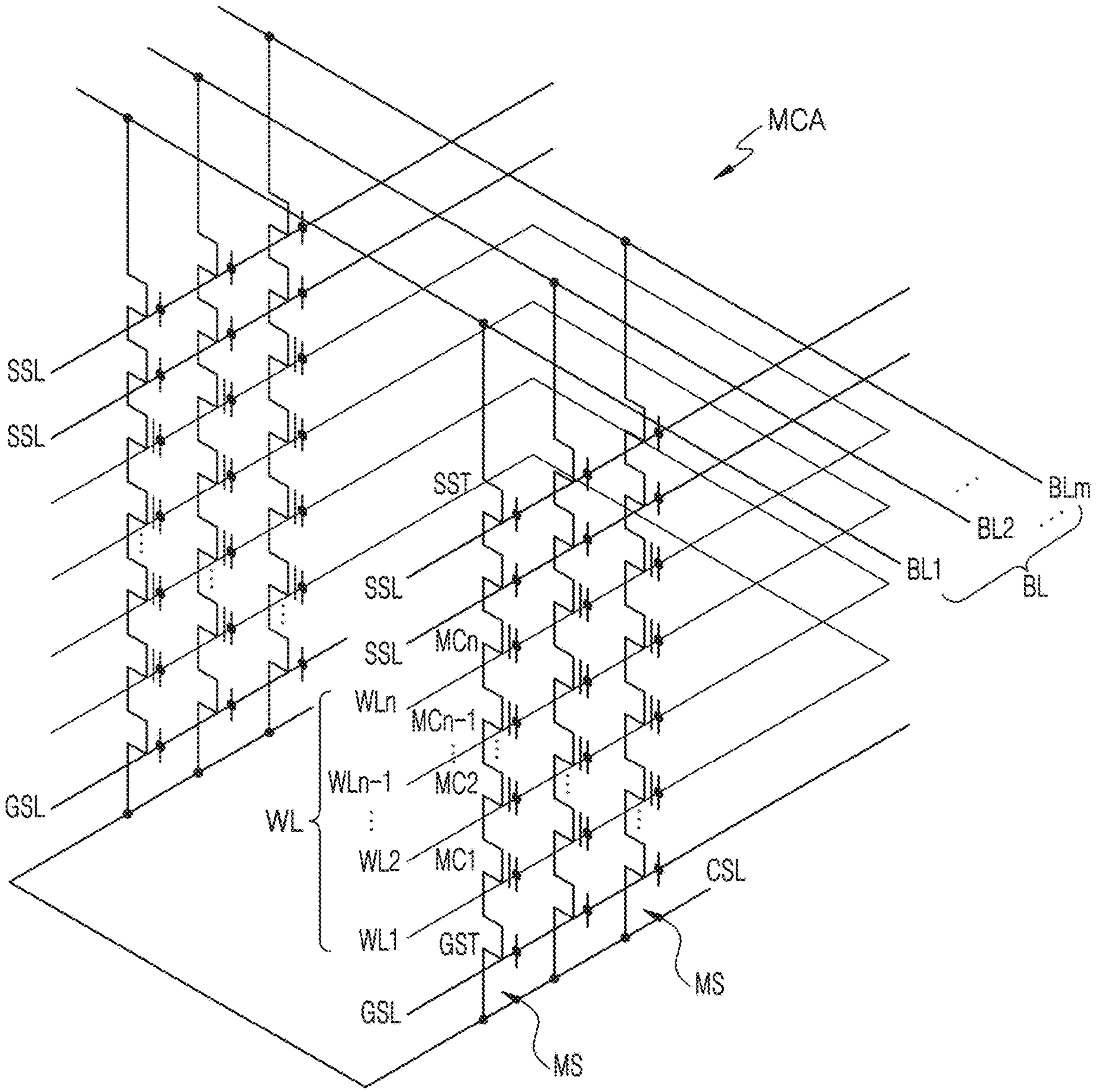
FIG. 3 is an equivalent circuit diagram of a memory cell array MCA of a vertical non-volatile memory device according to some example embodiments of the inventive concepts.

FIG. 3 is an equivalent circuit diagram of a memory cell array MCA of a vertical non-volatile memory device according to some example embodiments of the inventive concepts.

In particular, FIG. 3 may be an equivalent circuit diagram of the vertical non-volatile memory device 10 described above, for example, a memory cell array MCA of a vertical NAND flash memory device. Each or one or more of the memory cell blocks BLK1, BLK2, BLKn (n is a positive integer) illustrated in FIG. 2 may include a memory cell array MCA having the circuit configuration illustrated in FIG. 3.

The memory cell array MCA may include a plurality of memory cell strings MS. The memory cell array MCA may include a plurality of bit lines BL: BL1, BL2, . . . , BLm (m is a positive integer), a plurality of word lines WL: WL1, WL2, . . . , WLn−1, WLn (n is a positive integer), at least one string select line SSL, at least one ground select line GSL, and/or a common source line CSL.

A plurality of memory cell strings MS may be formed between the plurality of bit lines BL and the common source line CSL. FIG. 3 illustrates a case where each or one or more of the plurality of memory cell strings MS include two string select lines SSL, but the inventive concepts are not limited thereto. For example, each or one or more of the plurality of memory cell strings MS may include one string select line SSL.

Each or one or more of the plurality of memory cell strings MS may include a string select transistor SST, a ground select transistor GST, and/or a plurality of memory cell transistors MC1, MC2, . . . , MCn−1, MCn (n is a positive integer). The memory cell transistors MC1, MC2, . . . , MCn−1, MCn (n is a positive integer) may be memory cells.

A drain region of the string select transistor SST may be connected to the bit line BL, and a source region of the ground select transistor GST may be connected to the common source line CSL. The common source line CSL may be a region in which the source regions of the plurality of ground selection transistors GST are commonly connected.

The string select transistor SST may be connected to the string select line SSL, and the ground select transistor GST may be connected to the ground select line GSL. The plurality of memory cell transistors MC1, MC2, . . . , MCn−1, MCn (n is a positive integer) may be respectively connected to the plurality of word lines WL.

Figure 4:
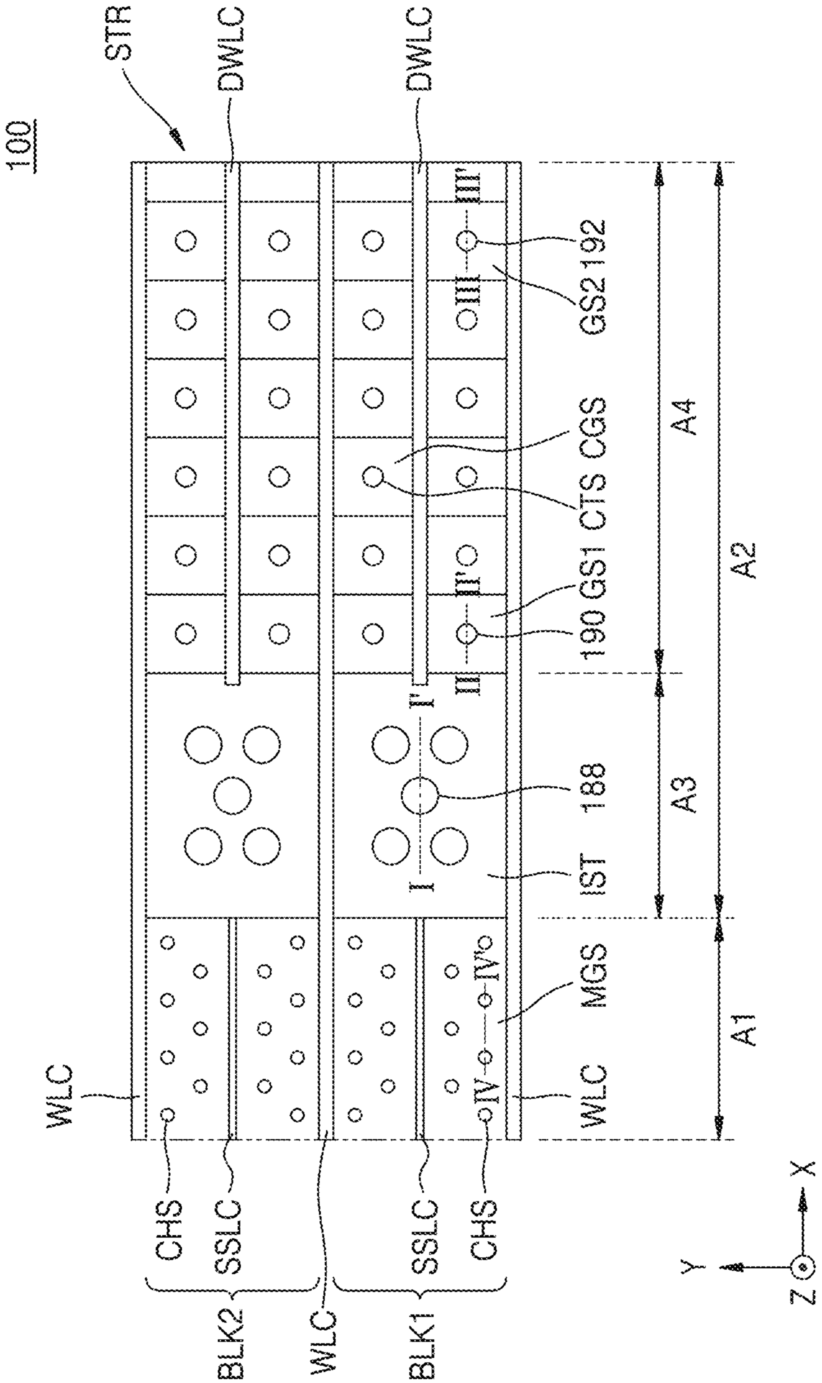
FIG. 4 is a plan view illustrating main components of a vertical non-volatile memory device according to some example embodiments of the inventive concepts.

FIG. 4 is a plan view illustrating main components of a vertical non-volatile memory device according to some example embodiments of the inventive concepts.

In particular, FIG. 4 is a plan view illustrating a partial configuration of memory cell blocks BLK1 and BLK2 among the plurality of memory cell blocks BLK1, BLK2, . . . , BLKn of FIG. 2. FIG. 4 may be diagrams in which the vertical non-volatile memory device 10 of FIGS. 1 to 3 described above is implemented. A vertical non-volatile memory device 100 may be a charge trap-type flash memory device.

The vertical non-volatile memory device 100 may include a memory cell area A1 and/or a connection area A2 positioned at one side of the memory cell area A1 in a horizontal direction (X direction). The connection area A2 may include a through electrode area A3 for electrical connection with the peripheral circuit structure PCS in FIG. 2 and/or a contact area A4 for electrical connection with gate lines of the memory cell area A1, that is, the ground select line GSL, the word lines WL, and/or the string select line SSL of FIG. 2.

In FIG. 4, the through electrode area A3 is positioned adjacent to a side (for example, the right side) of the memory cell area A1, but example embodiments are not limited thereto. For example, the through electrode area A3 may be positioned adjacent to the side of the contact area A4.

The cell array structure CAS described above may be positioned in the memory cell area A1 and/or the connection area A2. A plurality of word line cut structures WLC may be positioned to elongate in the first direction (X direction or a horizontal direction) from the memory cell area A1 and the connection area A2. The word line cut structures WLC may be positioned to be spaced apart from each other in the second direction (Y direction or a horizontal direction).

The memory cell blocks BLK1 and/or BLK2 may be positioned between the word line cut structures WLC in the second direction (Y direction). In some example embodiments, a plurality of dummy word line cut structures DWLC extending long in the first direction (X direction or a horizontal direction) may be positioned in the memory cell blocks BLK1 and/or BLK2.

A string select line cut structure SSLC may be positioned in the memory cell area A1. The memory cell area A1 may include a memory gate stack structure MGS and/or a channel structure CHS formed in the memory gate stack structure MGS. The memory gate stack structure MGS and the channel structure CHS will be described in detail later. The through electrode area A3 may include a through electrode 188 formed in the insulator stack structure IST. The insulator stack structure IST and the through electrode 188 will be described in detail later.

In the contact area A4, contact gate stack structures CGS having step areas STR in a first direction (X direction or a horizontal direction) may be positioned. In each or one or more of the step areas STR, a contact electrode CTS for electrical contact with the gate lines, that is, the ground select line GSL, the word lines WL, and/or the string select line SSL of FIG. 2, may be formed. The contact electrodes CTS may be formed in contact with the gate stack structure CGS.

In FIG. 4, for convenience, a first contact electrode 190 formed in the first contact gate stack structure GS1 of the upper step in the first direction (X direction), and a second contact electrode 192 formed on the second contact gate stack structure GS2 of the lower step are shown. The first contact gate stack structure GS1, the first contact electrode 190, the second contact gate stack structure GS2, and the second contact electrode 192 will be described in detail later.

Figure 5:
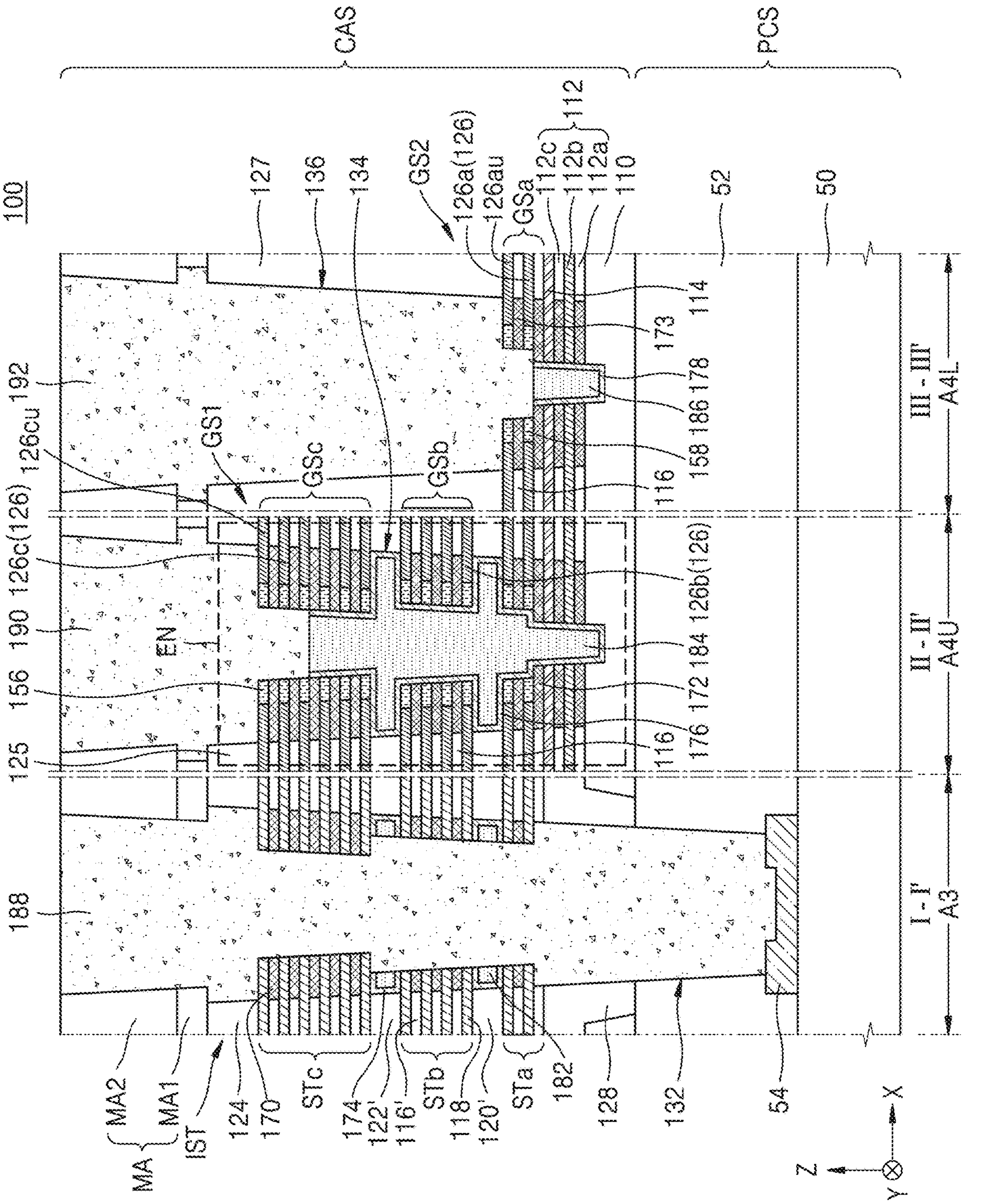
FIG. 5 is a cross-sectional view showing a cross-sectional configuration taken along line I-I' of FIG. 4, a cross-sectional configuration taken along line II-II' of FIG. 4, and a cross-sectional configuration taken along line III-III' of FIG. 4.
Figure 6:
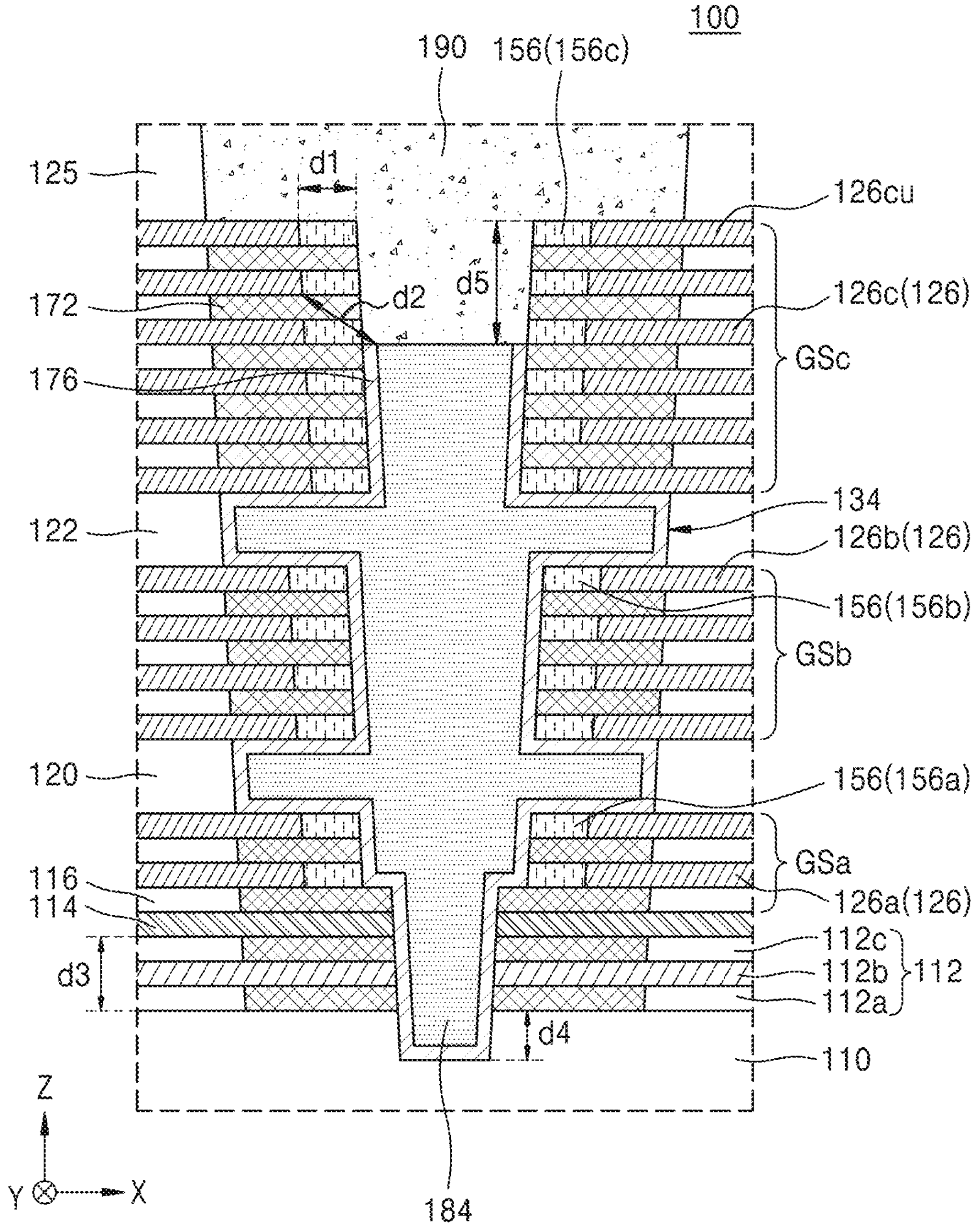
FIG. 6 is an enlarged cross-sectional view of a partial region of FIG. 5.

FIG. 5 is a cross-sectional view showing a cross-sectional configuration taken along line I-I' of FIG. 4, a cross-sectional configuration taken along line II-II' of FIG. 4, and a cross-sectional configuration taken along line III-III' of FIG. 4, and FIG. 6 is an enlarged cross-sectional view of a partial region of FIG. 5.

In particular, FIG. 5 illustrates a partial cross-section of the connection area A2 in FIG. 4. In FIG. 5, section I-I' shows the through electrode area A3 in the connection area A2, section II-II' shows the first contact area A4U of the upper step in the contact areas A4 constituting the connection area A2, and section III-III' shows the second contact area A4L of the lower step in the connection areas A2. FIG. 6 is an enlarged view of the "EN" area of FIG. 5.

The vertical non-volatile memory device 100 includes a peripheral circuit structure PCS formed on the second substrate 50. The second substrate 50 may be a lower substrate. The peripheral circuit structure PCS may include peripheral transistors, passive elements, and/or capacitors, and/or the like, but is omitted herein for convenience. The second substrate 50 may include Si, Ge, and/or SiGe. A peripheral circuit insulating layer 52 is formed on the second substrate 50. A peripheral circuit wiring layer 54 is formed on the second substrate 50 and/or in the peripheral circuit insulating layer 52. The peripheral circuit wiring layer 54 may be formed of a metallic material such as tungsten and/or copper.

The vertical non-volatile memory device 100 includes a cell array structure CAS formed on a first substrate 110. The first substrate 110 may be positioned on the second substrate 50. The first substrate 110 may have a vertical direction (Z direction) perpendicular to the surface thereof and a horizontal direction (X direction) horizontal to the surface. The first substrate 110 may be an upper substrate. The first substrate 110 may include Si, Ge, and/or SiGe. The first substrate 110 may be referred to as a semiconductor layer.

As described above, the memory cell area A1 in FIG. 4 including memory cells may be positioned on the first substrate 110, and the connection area A2 in FIG. 4 may be positioned on one side of the memory cell area A1 in FIG. 4.

In addition, as described above, the connection area A2 in FIG. 4 may include the memory cell area A1 in FIG. 4 and/or the peripheral circuit structure PCS in FIG. 2, that is, a through electrode area A3 for electrical connection with the peripheral circuit wiring layer 54, and/or a contact area A4 for electrical connection with the memory cell area A1 of FIG. 4. In FIG. 5, the first contact area A4U of the upper step and the second contact area A4L of the lower step are indicated in the first direction (X direction) of the contact areas A4 for convenience.

Here, first, the cross-sectional structure of the first contact area A4U of the upper step and the second contact area A4L of the lower step will be described in detail.

The first contact area A4U and/or the second contact area A4L may include a plurality of gate lines 126 stacked in a vertical direction (Z direction) of the first substrate 110, and a first contact gate stack structure GS1 and/or a second contact gate stack structure GS2 including a plurality of second insulating layers 116 formed between the gate lines 126. The second insulating layers 116 may be formed of silicon oxide.

In the first contact area A4U and/or the second contact area A4L, first and/or second composite films 112 and 114 are formed on the first substrate 110 between the first substrate 110 and the gate lines 126. The gate lines 126 may be made of tungsten, nickel, cobalt, tantalum, tungsten nitride, titanium nitride, and/or tantalum nitride, and/or a combination thereof, but are not limited to these.

The first composite film 112 may include a plurality of membranes, for example, an oxide film 112*a*, a nitride film 112*b*, and/or an oxide film 112*c*. The second composite film 114 may be a polysilicon film doped with impurities. The second composite film 114 may be used as a common source line. The first and/or second composite films 112 and 114 may secure a physical distance between the gate lines 126 and the first substrate 110 when a first contact hole 134 and/or a second contact hole 136 are formed.

The first contact gate stack structure GS1 may include a lower contact gate stack structure GSa, an intermediate contact gate stack structure GSb, and/or an upper contact gate stack structure GSc sequentially stacked on the first substrate 110. The second contact gate stack structure GS2 may include a lower contact gate stack structure Gsa formed on the first substrate 110.

The gate lines 126 of the first contact gate stack structure GS1 may include an upper gate line 126*c* positioned in an upper portion, an intermediate gate line 126*b* positioned in the middle portion, and/or a lower gate line 126*a* positioned in the lower portion. The gate lines 126 of the second contact gate stack structure GS2 may include a lower gate line 126*a* positioned thereunder.

The first contact gate stack structure GS1 may include the first intermediate insulating layer 120 and/or the second intermediate insulating layer 122 respectively formed between the lower contact gate stack structure Gsa and the intermediate contact gate stack structure GSb and between the intermediate contact gate stack structure GSb and the upper contact gate stack structure GSc.

The first intermediate insulating layer 120 and/or the second intermediate insulating layer 122 may be thicker than the second insulating layers 116. The first intermediate insulating layer 120 and/or the second intermediate insulating layer 122 may be formed of silicon oxide.

The first contact gate stack structure GS1 may include a second cover insulating layer 125 formed on the upper gate stack structure GSc. The second cover insulating layer 125 may be a second mold insulating layer formed on the upper contact gate stack structure GSc. The second cover insulating layer 125 may be formed of silicon oxide.

The second contact gate stack structure GS2 may include a third cover insulating layer 127 formed on the lower contact gate stack structure GSc. The third cover insulating layer 127 may be a third mold insulating layer formed on the lower contact gate stack structure Gsa. The third cover insulating layer 127 may be thicker than the second cover insulating layer 125. The third cover insulating layer 127 may be formed of silicon oxide.

A first contact hole 134 is formed in the first contact gate stack structure GS1 so that one end of the gate lines 126 protrude from the inner wall while extending in the vertical direction (Z direction). A second contact hole 136 is formed in the second contact gate stack structure GS2 so that one end of the gate lines 126 protrude from the inner wall while extending in the vertical direction (Z direction).

The first contact hole 134 and/or the second contact hole 136 may be defined by a mask layer MA. The first contact hole 134 and/or the second contact hole 136 may use the mask layer MA as an etch mask during a manufacturing process. The mask layer MA may include a first mask layer MA1 and/or a second mask layer MA2. The first mask layer MA1 and/or the second mask layer MA2 may be formed of carbon and/or an amorphous film.

In the first contact gate stack structure GS1, one end of the gate lines 126 is formed to protrude from the inner wall of the first contact hole 134. In the second contact gate stack structure GS2, one end of the gate lines 126 is formed to protrude from the inner wall of the second contact hole 136.

In the first contact gate stack structure GS1, a plurality of first separation insulating layers 156 are formed for each or one or more gate line 126 in the horizontal direction (X direction) in contact with the protruding gate lines 126 on both sides of the first contact hole 134. The first separation insulating layers 156 may be formed of silicon nitride.

The first separation insulating layers 156 may include a first upper separation insulating layer 156*c* positioned at an upper portion, a first intermediate separation insulating layer 156*b* positioned in the middle portion, and a first lower separation insulating layer 156*a* positioned at a lower portion.

In the second contact gate stack structure GS2, a plurality of second separation insulating layers 158 are formed for each or one or more gate line 126 in the horizontal direction (X direction) in contact with the protruding gate lines 126 on both sides of the second contact hole 136. The second separation insulating layers 158 may be formed of silicon nitride.

In the first contact gate stack structure GS1, a plurality of second filling insulating layers 172 are formed in the horizontal direction between the first separation insulating layers 156 and the second insulating layers 116 inside the first contact hole 134. A portion of the bottom of the first contact hole 134 may be located inside the first substrate 110. A second etching blocking insulating layer 176 may be formed on one side of the first separation insulating layers 156 and/or on a portion of the bottom of the first contact hole 134.

In the second contact gate stack structure GS2, a plurality of third filling insulating layers 173 are formed in the horizontal direction between the second separation insulating layers 158 and the second insulating layers 116 inside the second contact hole 136. A portion of the bottom of the second contact hole 136 may be located inside the first substrate 110. A third etching blocking insulating layer 178 may be formed on one side of the second separation insulating layers 158 and a portion of the bottom of the second contact hole 136.

In the first contact area A4U, a second buried insulating layer 184 is formed in the first contact hole 134 of the first contact gate stack structure GS1. In some example embodiments, the second buried insulating layer 184 may be formed at a level lower than the uppermost surface of the upper contact gate stack structure GSc. In some example embodiments, unlike FIGS. 5 and 6, the second buried insulating layer 184 may be formed at the same level as the uppermost surface of the upper contact gate stack structure GSc.

A first contact electrode 190 is formed on the first buried insulating layer 284, the upper gate line 126*c*, and/or the first upper separation insulating layer 156*c*. The first contact electrode 190 may be formed of a metallic material such as tungsten and/or copper. The first contact electrode 190 may be positioned below the upper surface of the upper contact gate stack structure GSa in the first contact hole 134.

The first contact electrode 190 may easily make electrical contact with the first uppermost gate line 126*cu* positioned at the uppermost one of the upper gate lines 126*c* due to the position on the first contact hole 134 and the second buried insulating layer 184. The first contact electrode 190 may be electrically isolated by the first separation insulating layers 156 from other gate lines 126 than the first uppermost gate line 126*cu* in the horizontal direction (X direction).

In the second contact area A4L, a third buried insulating layer 186 is formed in the second contact hole 136 of the second contact gate stack structure GS2. In some example embodiments, the third buried insulating layer 186 may be formed at a level lower than the uppermost surface of the lower contact gate stack structure GSa. In some example embodiments, unlike FIG. 5, the third buried insulating layer 186 may be formed at the same level as the uppermost surface of the lower contact gate stack structure GS a.

A second contact electrode 192 is formed on the third buried insulating layer 186, the lower gate line 126*a*, and/or the second separation insulating layer 158. The second contact electrode 192 may be formed of a metallic material such as tungsten and/or copper. The second contact electrode 192 may be positioned below the upper surface of the lower contact gate stack structure GSc in the second contact hole 136.

The second contact electrode 192 may easily make electrical contact with the second uppermost gate line 126*au* positioned on the uppermost one of the lower gate lines 126*a*, due to the location on the second contact hole 136 and the third buried insulating layer 186. The second contact electrode 192 may be electrically isolated by the second separation insulating layers 158 from the gate lines 126 other than the second uppermost gate line 126*au* in the horizontal direction (X direction).

Next, the memory cell area A1 of FIG. 4 and the peripheral circuit structure PCS of FIG. 2, that is, the through electrode area A3 for electrical connection with the peripheral circuit wiring layer 54, will be described in detail.

The through electrode area A3 may be formed on a side (for example, the left side) of the first contact area A4U of the upper step to reduce the length in the horizontal direction (X direction) of the connection area A2 of FIG. 4. The through electrode area A3 may include an insulator stack structure IST and a through electrode 188.

The insulator stack structure IST may include a through insulating layer 128 penetrating the first substrate 110, a plurality of sacrificial films 118 stacked in the vertical direction (Z direction) on the through insulating layer 128, and/or a plurality of first insulating layers 116' formed between the sacrificial films 118.

The first insulating layers 116' may be positioned at the same level as the second insulating layers 116 of the first and second contact areas A4U and A4L. The first insulating layers 116' may be formed of silicon oxide. The sacrificial films 118 may be formed of silicon nitride. The through insulating layer 128 may be made of silicon oxide.

The insulator stack structure IST may include a lower insulator stack structure STa, an intermediate insulator stack structure STb, and/or an upper insulator stack structure STc sequentially stacked on the through insulating layer 128. The insulator stack structure IST may include a first intermediate insulating layer 120' and a second intermediate insulating layer 122' respectively formed between the lower insulator stack structure STa and the intermediate insulator stack structure sTb, and between the intermediate insulator stack structure STb and the upper insulator stack structure STc. The first intermediate insulating layer 120' and/or the second intermediate insulating layer 122' may be formed of silicon oxide.

The first intermediate insulating layer 120' and the second intermediate insulating layer 122' may be formed on the same level as the first intermediate insulating layer 120 and the second intermediate insulating layer 122 of the first and second contact areas A4U and A4L. The first intermediate insulating layer 120' and/or the second intermediate insulating layer 122' may be thicker than the first insulating layers 116*b*' and/or the sacrificial films 118.

The first cover insulating layer 124 formed on the upper insulator stack structure STc constituting the insulator stack structure IST may be included. The first cover insulating layer 124 may be a first mold insulating layer formed on the upper insulator stack structure STc. The first cover insulating layer 124 may be formed of silicon oxide.

The sacrificial films 118 of the through electrode area A3 may be positioned at the same level as the gate lines 126 of the first and/or second contact areas A4U and A4L. The first insulating layers 116' of the through electrode area A3 may be located at the same level as the second insulating layers 116 of the first and/or second contact areas A4U and A4L.

The through electrode area A3 may include a through hole 132 extending in the vertical direction (Z direction) from the peripheral circuit wiring layer 54 of the second substrate 50 inside the insulator stack structure IST. The through hole 132 may be defined by the mask layer MA. The through hole 132 may use the mask layer MA as an etch mask during a manufacturing process.

The through hole 132 may expose an upper surface of the peripheral circuit wiring layer 54. The through hole 132 may be formed in the same process as the first and/or second contact holes 134 and 136 of the first and/or second contact areas A4U and A4L.

The sacrificial films 118 may be positioned to protrude from the inner wall of the through hole 132. A plurality of first filling insulating layers 170 are formed in the horizontal direction (X direction) between the sacrificial films 118 protruding in the through hole 132. A first etching blocking insulating layer 174 is formed on one side of the first intermediate insulating layer 120' and the second intermediate insulating layer 122' in the through hole 132. A first buried insulating layer 182 is formed on one side of the first etching blocking insulating layer 174 in the through hole 132.

The through electrode area A3 may include the through electrode 188 buried in the through hole 132. The through electrode 188 may be formed of a metallic material such as tungsten or copper. The through electrode 188 may contact the lower insulator stack structure STa, the intermediate insulator stack structure STb, and the upper insulator stack structure STc within the through hole 132.

As described above, the vertical non-volatile memory device 100 of the inventive concepts forms first and/or second separation insulating layers 156 and 158 for each or one or more gate line 126, respectively, in the first and/or second contact holes 134 and 136 of the first and/or second contact gate stack structures GS1 and GS2. Accordingly, in the vertical non-volatile memory device 100, the gate lines 126 and the first and second contact electrodes 190 and 192 are electrically separated from each other due to the first and/or second separation insulating layers 156 and 158, and the first and/or second uppermost gate lines 126*cu* and 126*au* may be in electrical contact with the first and/or second contact electrodes 190 and 192, respectively.

In the vertical non-volatile memory device 100, second and/or third buried insulating layers 184 and 186 are formed in the first and/or second contact holes 134 and 136 of the first and/or second contact gate stack structures GS1 and GS2, respectively, so that the first and/or second contact electrodes 190 and 192 may be easily formed in a manufacturing process. Accordingly, the non-volatile memory device 100 according to the inventive concepts may be manufactured more efficiently.

In addition, in the vertical non-volatile memory device 100, second and/or third etch-blocking insulating layers 176 and 178 are formed between the first and/or second separation insulating layers 156 and 158 and/or the buried insulating layers 184 and 186, respectively, so that the first and/or second separation insulating layers 156 and 158 may be protected in the horizontal direction during the manufacturing process.

Figure 7:
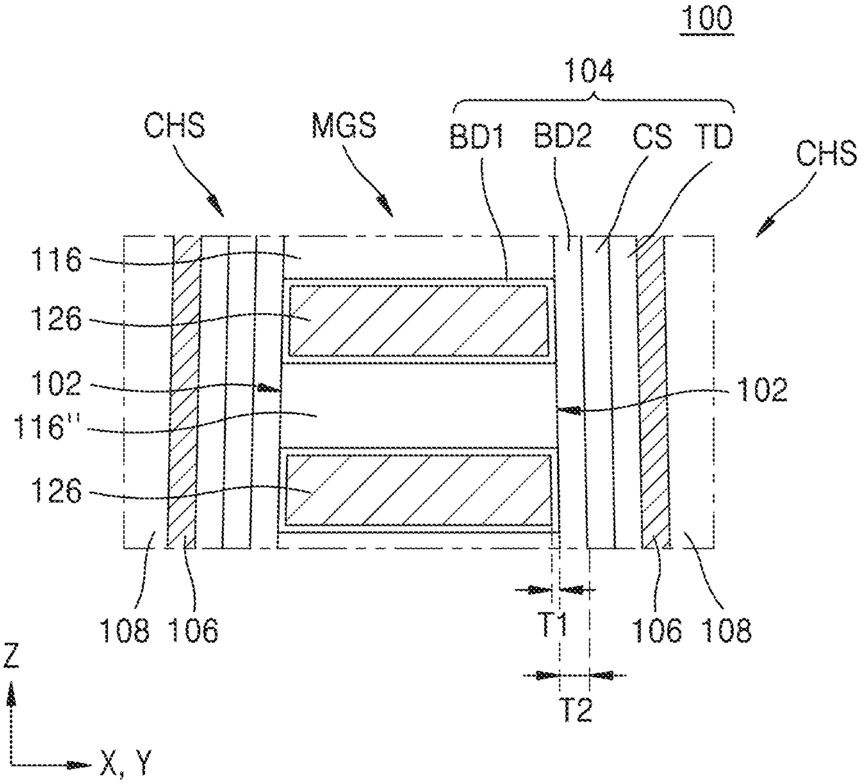
FIG. 7 is an enlarged cross-sectional view illustrating a part of gate lines and a channel structure of a vertical non-volatile memory device according to some example embodiments of the inventive concepts.

FIG. 7 is an enlarged cross-sectional view illustrating a part of gate lines and a channel structure of a vertical non-volatile memory device according to some example embodiments of the inventive concepts.

In particular, FIG. 7 is an enlarged cross-sectional view of a partial region of the cross-section taken along line IV-IV' of FIG. 4. The vertical non-volatile memory device 100 may include a memory gate stack structure MGS in a memory cell area A1 of FIG. 4 and/or a channel structure CHS formed in the memory gate stack structure MGS.

The memory gate stack structure MGS may include third insulating layers 116" and/or gate lines 126 stacked on the first substrate 110 in FIGS. 5 and 6. The third interlayer insulating layers 116" may be formed on the same level as the first and/or second insulating layers 116 and 116' of the through electrode area A3 of FIG. 5 and the first and/or second contact areas A4U and A4L.

The channel structure CHS may be formed in the channel hole 102 formed at one side of the memory gate stack structure MGS. The channel structure CHS may include an information storage structure 104, a channel film 106, and/or a channel buried insulating layer 108. The information storage structure 104 includes first and/or second blocking insulating layers BD1 and BD2, a charge storage layer CS, and/or a tunneling insulating layer TD sequentially formed in the horizontal direction (X direction and Y direction) of the channel film 106 from the gate lines 126.

The first blocking insulating layer BD1 may surround the gate lines 126. The first blocking insulating layer BD1 may be positioned to face each other between the gate lines 126 in the stacking direction, that is, in the vertical direction (Z-axis direction). The first blocking insulating layer BD1 may have a first thickness T1.

The second blocking insulating layer BD2 may be a continuous film extending in the stacking direction, that is, in the vertical direction (Z-axis direction) in the channel hole 102. The second blocking insulating layer BD2 may have a second thickness T2 that is greater than the first thickness T1. The first thickness T1 and the second thickness T2 may be several tens of Å.

Each or one or more of the first blocking insulating layer BD1 and/or the second blocking insulating layer BD2 may be formed of silicon oxide, silicon nitride, and/or metal oxide. For example, the second blocking insulating layer BD2 is made of a silicon oxide film, and/or the first blocking insulating layer BD1 may be formed of a metal oxide film having a higher dielectric constant than a silicon oxide film. In this embodiment, the information storage structure 104 includes a first blocking insulating layer BD1 and/or a second blocking insulating layer BD2, but the inventive concepts are not limited thereto.

The tunneling insulating layer TD, the charge storage layer CS, and/or the second blocking insulating layer BD2 may be continuous films extending in the stacking direction, that is, in the vertical direction (Z-axis direction) in the channel hole 102. The charge storage layer CS may be a region in which electrons passing through the tunneling insulating layer TD from the channel film 106 may be stored and/or trapped during a program operation. Electrons stored in the charge storage layer CS may be moved to the channel film 106 through the tunneling insulating layer TD again during the erase operation.

The charge storage layer CS may include silicon nitride, boron nitride, silicon boron nitride, and/or polysilicon doped with impurities. The tunneling insulating layer TD may include silicon oxide, hafnium oxide, aluminum oxide, zirconium oxide, and/or tantalum oxide, and/or the like.

FIGS. 8 to 18 are cross-sectional views illustrating a method of manufacturing a vertical non-volatile memory device, according to some example embodiments of the inventive concepts.

In particular, FIGS. 8 to 18 are diagrams illustrating a method of manufacturing the vertical non-volatile memory device 100 shown in FIGS. 4 to 6. In FIGS. 8 to 18, the same reference numerals as in FIGS. 4 to 6 denote the same members.

Figure 8:
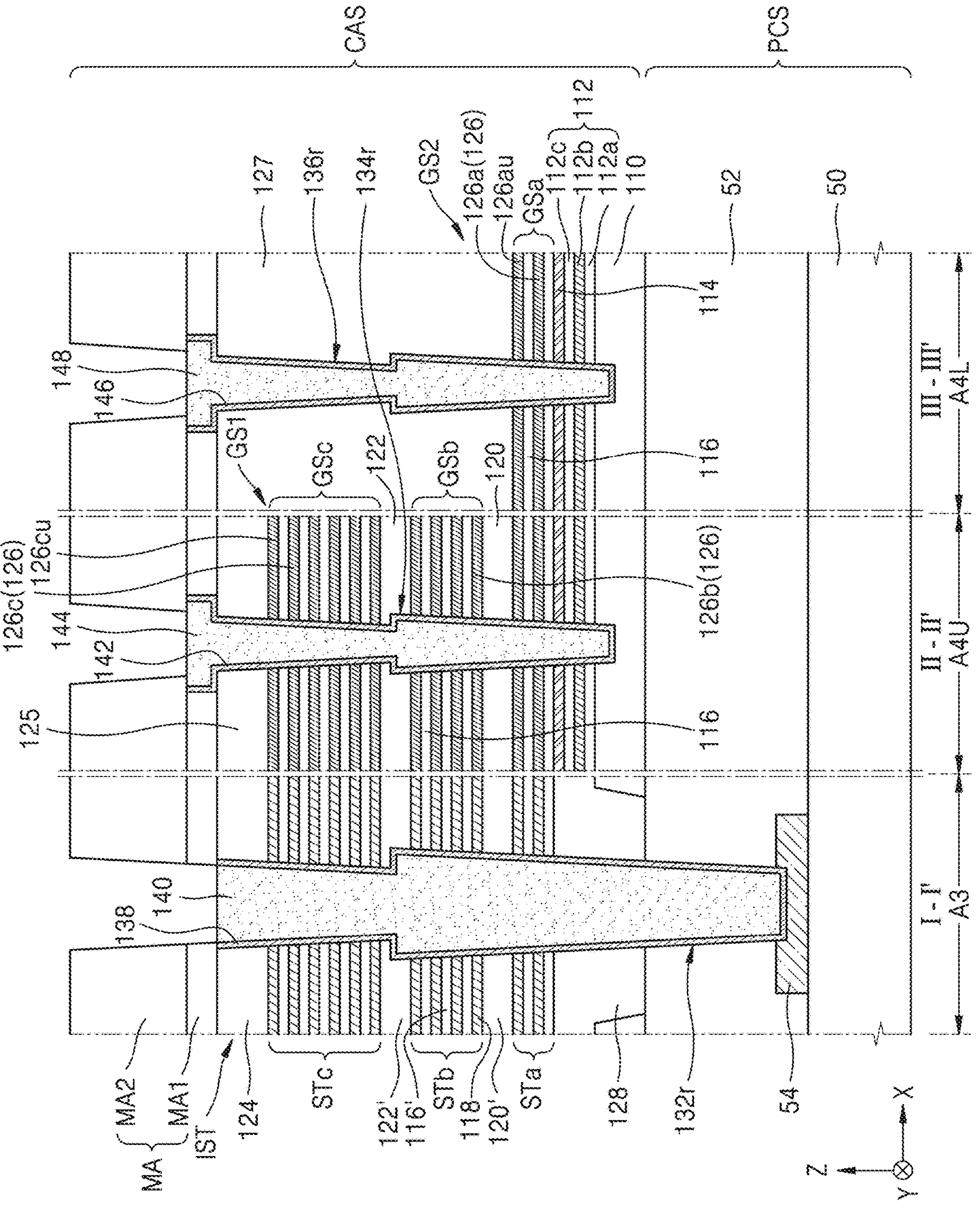
FIGS. 8 to 18 are cross-sectional views illustrating a method of manufacturing a vertical non-volatile memory device, according to some embodiments of the inventive concepts.

Referring to FIG. 8, the vertical non-volatile memory device 100 in FIGS. 4 to 6 includes a peripheral circuit structure PCS formed on the second substrate 50. A peripheral insulating layer 52 and/or a peripheral circuit wiring layer 54 are formed on the second substrate 50. The peripheral circuit 30 in FIG. 1 may be formed on the second substrate 50. The second substrate 50, the peripheral insulating layer 52, and/or the peripheral circuit wiring layer 54 may constitute a peripheral circuit structure PCS. The peripheral circuit wiring layer 54 may be formed of a metallic material such as tungsten and/or copper.

The first substrate 110 is attached on the peripheral insulating layer 52 of the second substrate 50. An insulator stack structure IST is formed on the first substrate 110. The insulator stack structure IST may include a through insulating layer 128 penetrating the first substrate 110, a plurality of sacrificial films 118 stacked in the vertical direction (Z direction) on the through insulating layer 128, and/or a plurality of first insulating layers 116' formed between the sacrificial films 118.

The insulator stack structure IST may include a lower insulator stack structure STa, an intermediate insulator stack structure STb, and/or an upper insulator stack structure STc sequentially stacked on the through insulating layer 128.

The insulator stack structure IST may further include a first intermediate insulating layer 120' and/or a second intermediate insulating layer 122' respectively formed between the lower insulator stack structure STa and the intermediate insulator stack structure STb, and/or between the intermediate insulator stack structure STb and the upper insulator stack structure STc. A first cover insulating layer 124 is formed on the upper insulator stack structure STc constituting the insulator stack structure IST. The first cover insulating layer 124 may be formed of silicon oxide.

A cell array structure CAS of the vertical non-volatile memory device 100 of FIGS. 5 and 6 may be formed on the first substrate 110. The cell array structure CAS may include a first contact area A4U of an upper step and/or a second contact area A4L of a lower step.

In more detail, the first and/or second composite films 112 and 114 are formed on the first substrate 110. The first composite film 112 may include a plurality of membranes, for example, an oxide film **112*a*, a nitride film 112*b*, and/or an oxide film 112*c*. The second composite film 114 may be a polysilicon film doped with impurities. The second composite film 114** may be used as a common source line.

First and/or second contact gate stack structures GS1 and GS2 are formed on the second composite film 114. The first and/or second contact gate stack structures GS1 and GS2 are formed in the first and/or second contact areas A4U and A4L, respectively.

By sequentially forming the lower contact gate stack structure GSa, the first intermediate insulating layer 120, the intermediate contact gate stack structure GSb, the second intermediate insulating layer 122, and/or the upper contact gate stack structure GSc on the second composite film 114 of the first contact area A4U, a first contact gate stack structure GS1 is formed. A lower contact gate stack structure GSa is formed on the second composite film 114 of the second contact area A4L to form a second contact gate stack structure GS2.

The lower contact gate stack structure GSa, the intermediate contact gate stack structure GSb, and/or the upper contact gate stack structure GSc of the first contact area A4U include a plurality of gate lines 126 stacked in the vertical direction (Z direction) of the first substrate 110 and a plurality of second insulating layers 116 formed between the gate lines 126. The gate lines 126 may be made of tungsten, nickel, cobalt, tantalum, tungsten nitride, titanium nitride, and/or tantalum nitride, and/or a combination thereof, but are not limited to these.

The gate lines 126 of the upper contact gate stack structure GSc, the intermediate contact gate stack structure GSb, and/or the lower contact gate stack structure GSa may include an upper gate line **126*c*, an intermediate gate line 126*b*, and/or a lower gate line 126*a*. The uppermost member of the upper gate line 126*c* may be the first uppermost gate line 126*cu***.

The lower contact gate stack structure GSa of the second contact area A4L may include a plurality of gate lines 126 stacked in the vertical direction (Z direction) of the first substrate 110 and/or a plurality of second insulating layers 116 formed between the gate lines 126. The gate lines 126 of the lower contact gate stack structure GSa may include a lower gate line **126*a* positioned thereunder. The uppermost member of the lower gate line 126*a* may be the second uppermost gate line 126*au***.

After removing the sacrificial films (not shown) formed on the first substrate 110 at the same level as the through electrode area A3, the gate lines 126 may be formed through a replacement process in which a metal material is filled in the removed portion. The gate lines 126 may be formed at the same level as the sacrificial films 118 in the through electrode area A3.

The gate lines 126 of the first contact area A4U may be at the same level as the gate lines 126 of the second contact area A4L. The second insulating layers 116 of the first and/or second contact areas A4U and A4L may be formed on the same level as the first insulating layers 116' of the through electrode area A3. The first intermediate insulating layers 120' and 120 and/or the second intermediate insulating layers 122' and 122 may be thicker than the first and/or second insulating layers 116' and 116.

A second cover insulating layer 125 is formed on the upper gate stack structure GSc of the first contact area A4U. A third cover insulating layer 127 is formed on the lower gate stack structure GSa of the second contact area A4L. The second cover insulating layer 125 and/or the third cover insulating layer 127 may be formed of silicon oxide.

A thickness of the third cover insulating layer 127 may be greater than a thickness of the first cover insulating layer 124 and/or the second cover insulating layer 125. The first cover insulating layer 124, the second cover insulating layer 125, and/or the third cover insulating layer 127 may be simultaneously formed.

A mask layer MA is formed on each or one or more of the first cover insulating layer 124, the second cover insulating layer 125, and/or the third cover insulating layer 127. The mask layer MA may include a first mask layer MA1 and/or a second mask layer MA2. The first cover insulating layer 124, the insulator stack structure IST, and/or the peripheral circuit insulating layer 52 are etched using the mask layer MA as an etch mask, so that a preliminary through-hole 132*r* exposing the peripheral circuit wiring layer 54 is formed in the through electrode area A3.

The second cover insulating layer 125, the first contact gate stack structure GS1, and/or the first and second composite films 112 and 114 are etched using the mask layer MA as an etching mask, so that a first preliminary contact hole 134*r* exposing the first substrate 110 is formed in the first contact area A4U.

The third cover insulating layer 127, the second contact gate stack structure GS2, and/or the first and/or second composite films 112 and 114 are etched using the mask layer MA as an etching mask, so that a second preliminary contact hole 136*r* exposing the first substrate 110 is formed in the second contact area A4L. The preliminary through hole 132*r*, the first preliminary contact hole 134*r*, and/or the second preliminary contact hole 136*r* may be simultaneously formed.

First to third sacrificial spacer layers 138, 142, and/or 146 are respectively formed in the preliminary through hole 132*r*, the first preliminary contact hole 134*r*, and/or the second preliminary contact hole 136*r*. The first to third sacrificial spacer layers 138, 142, and/or 146 may be simultaneously formed.

Subsequently, the first sacrificial buried insulating layer 140 is buried on the first sacrificial spacer layer 138 in the preliminary through hole 132*r*. A second sacrificial buried insulating layer 144 is buried on the second sacrificial spacer layer 142 in the first preliminary contact hole 134*r*. A third sacrificial buried insulating layer 148 is buried on the third sacrificial spacer layer 146 in the third preliminary contact hole 136*r*.

Figure 9:
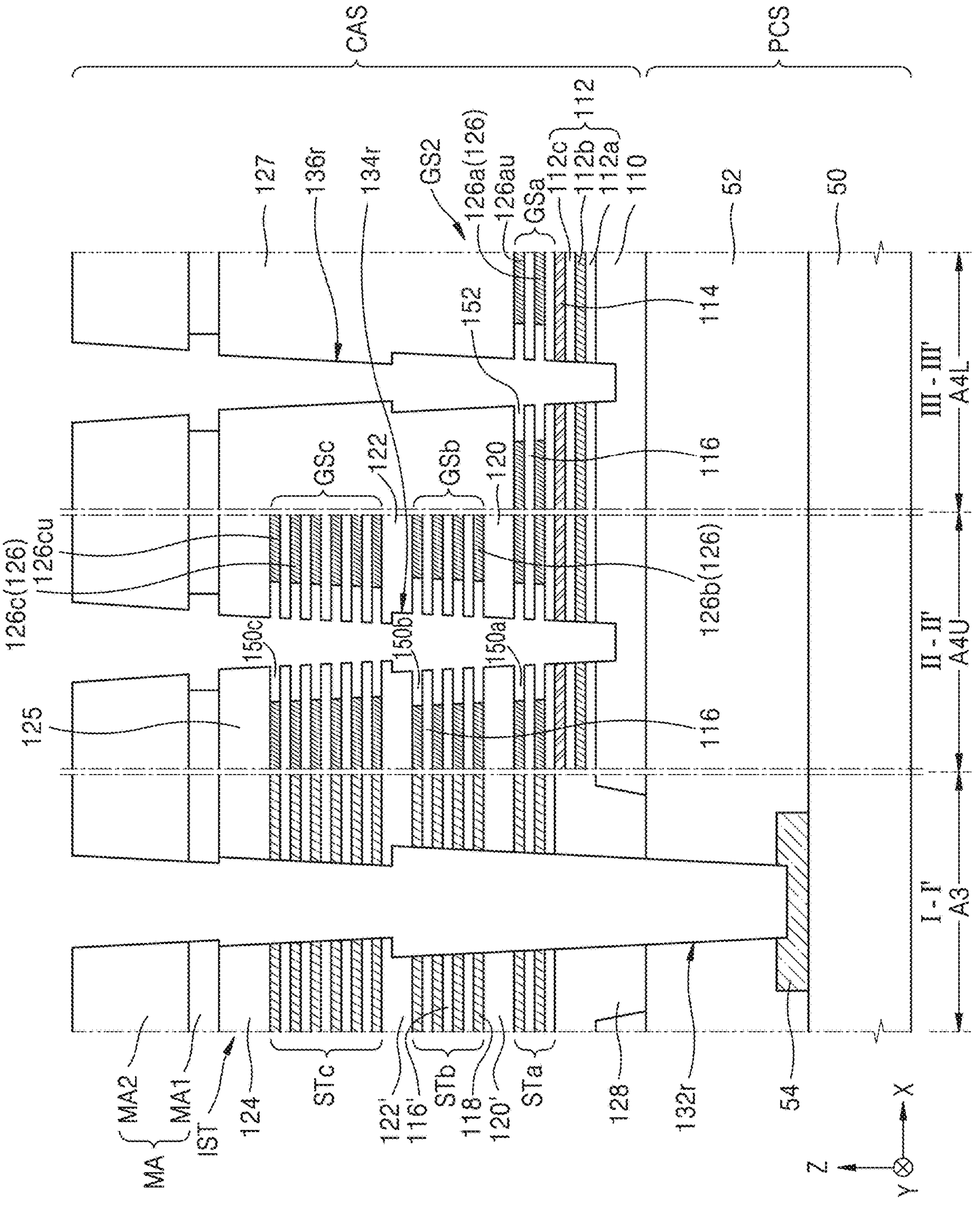

Referring to FIG. 9, the second sacrificial spacer layer 142 and/or the second sacrificial buried insulating layer 144 of the first contact area A4U are removed by an etching process. The third sacrificial spacer layer 146 and/or the third sacrificial buried insulating layer 148 of the second contact area A4L are removed by an etching process. The process of removing the second sacrificial spacer layer 142 and/or the second sacrificial buried insulating layer 144 and the process of removing the third sacrificial spacer layer 146 and/or the third sacrificial buried insulating layer 148 may be simultaneously performed.

Next, the gate lines 126 in contact with the first preliminary contact hole 134*r* of the first contact area A4U are etched in the horizontal direction (X direction) to form first recessed holes 150*a*, 150*b*, and/or 150*c*. The first recessed holes 150*a*, 150*b*, and/or 150*c* may be formed between the second insulating layers 116 of the lower contact gate stack structure GSa, the intermediate contact gate stack structure GSb, and/or the upper contact gate stack structure GSc of the first contact area A4U.

The gate lines 126 in contact with the second preliminary contact hole 136*r* of the second contact area A4L are etched in the horizontal direction (X direction) to form a second recessed hole 152. The second recessed hole 152 may be formed in the lower contact gate stack structure GSa of the second contact area A4L. Subsequently, the first sacrificial spacer layer 138 and/or the first sacrificial buried insulating layer 140 in the preliminary through hole 132*r* are removed by an etching process.

Figure 10:
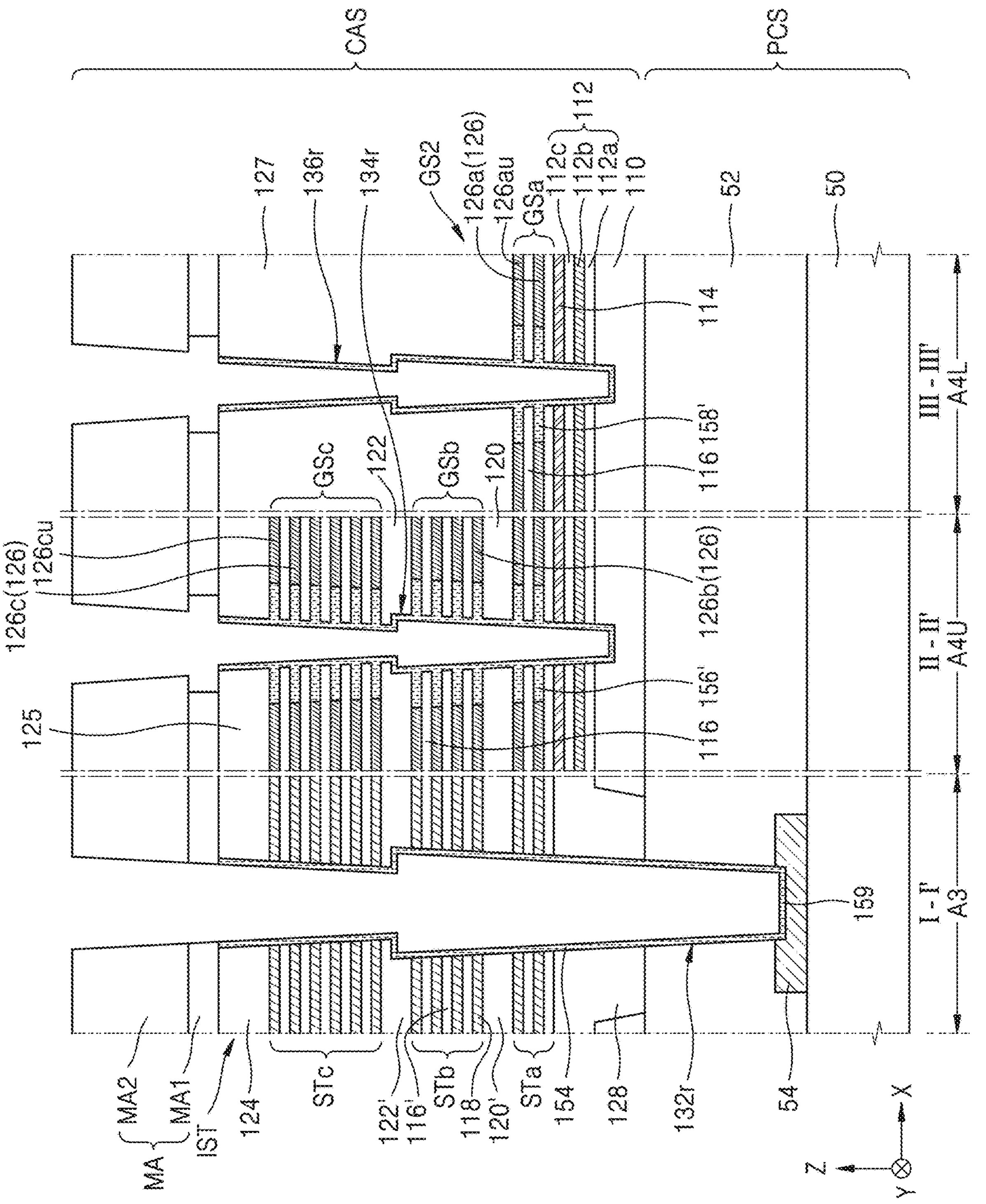

Referring to FIG. 10, the first separation insulating material film 156' is formed on the inner wall of the first preliminary contact hole 134*r* of the first contact area A4U and inside the first recessed holes 150*a*, 150*b*, and 150*c*. A second separation insulating material film 158' is formed on the inner wall of the second preliminary contact hole 136*r* of the second contact area A4L and inside the second recessed hole 152. The first separation insulating material film 156' and the second separation insulating material film 158' are formed of silicon nitride.

The first separation insulating material film 156' and the second separation insulating material film 158' may be formed at the same time. An additional separation insulating material film 159 may be formed inside the preliminary through hole 132*r* when the first separation insulating material film 156' and the second separation insulating material film 158' are formed.

Figure 11:
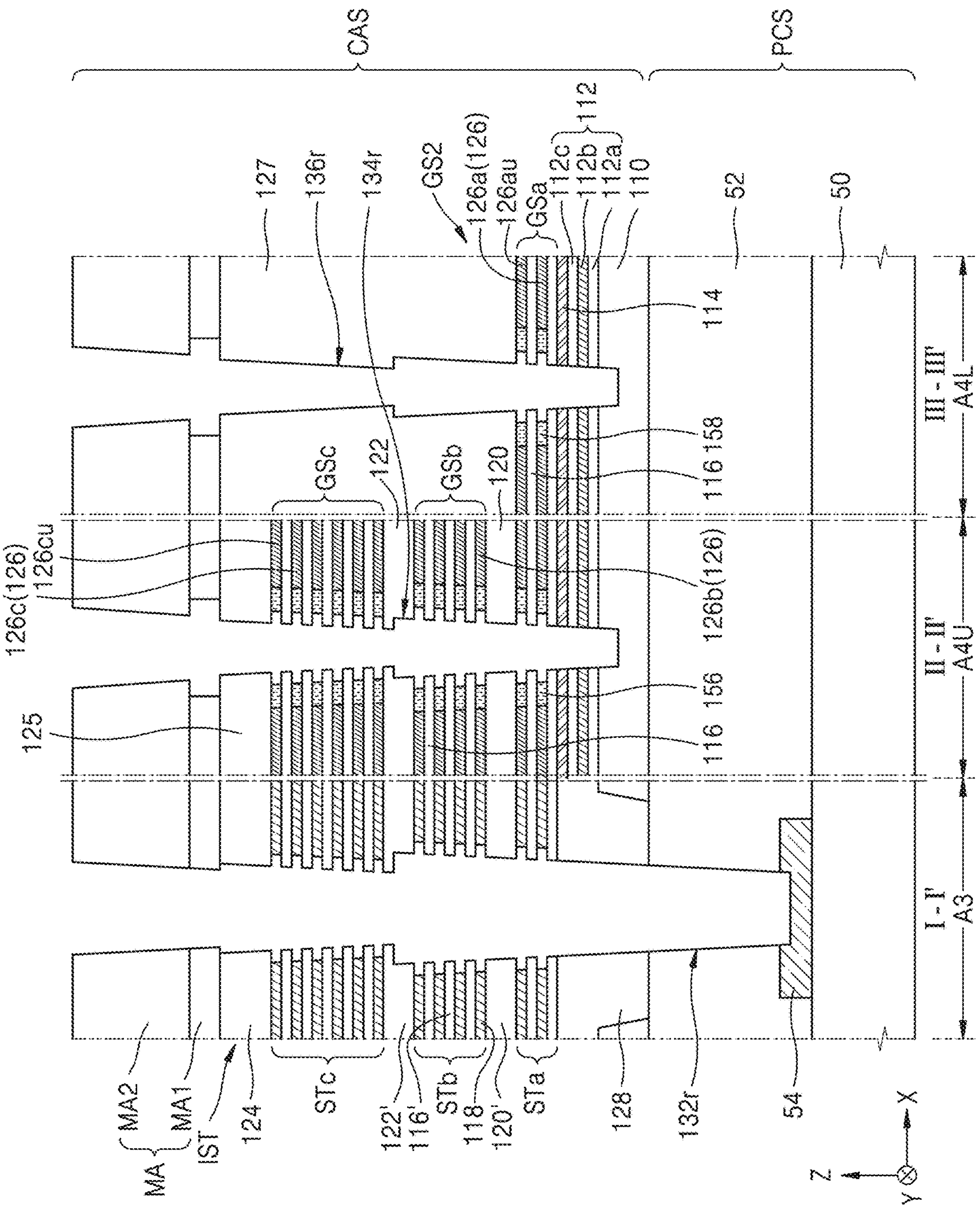

Referring to FIG. 11, the first separation insulating material film 156' in FIG. 10 formed on the inner wall of the first preliminary contact hole 134*r* in the first contact area A4U is etched. Accordingly, the first separation insulating layer 156 is formed only inside the first recessed holes 150*a*, 150*b*, and/or 150*c*.

The second separation insulating material film 158' in FIG. 10 formed on the inner wall of the second preliminary contact hole 136*r* in the second contact area A4L is etched. Accordingly, the second separation insulating layer 158 is formed only inside the fourth recessed hole 152. The first separation insulating layer 156 and/or the second separation insulating layer 158 are formed of silicon nitride.

The etching process of the first separation insulating material film 156' in FIG. 10 and the second separation insulating material film 158' in FIG. 10 may be simultaneously performed. Accordingly, the first separation insulating layer 156 and the second separation insulating layer 158 may be simultaneously formed. When the first separation insulating material film 156' in FIG. 10 and/or the second separation insulating material film 158' in FIG. 10 are etched, the additional separation insulating material film 159 in the through electrode area A3 may be removed.

Figure 12:
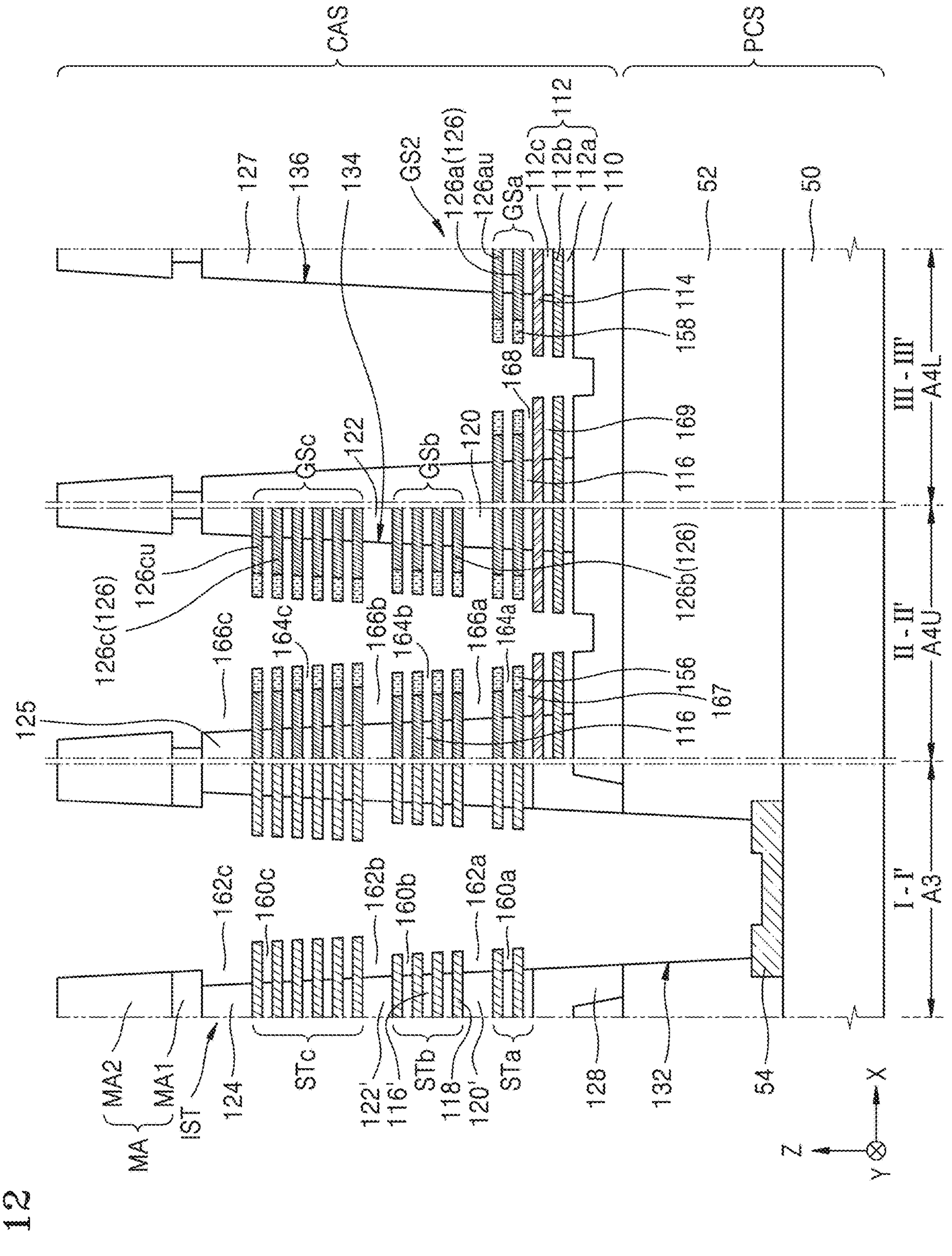

Referring to FIG. 12, the first cover insulating layer 124, the first insulating layers 116', the second intermediate insulating layer 122', the first intermediate insulating layer 120', the through insulating layer 128, and/or the peripheral circuit insulating layer 52 in contact with the preliminary through hole 132*r* in FIG. 11 are etched in the horizontal direction (X direction) to form the through hole 132 in the through electrode area A3.

As the first insulating layers 116' are etched in the horizontal direction, third recessed holes 160*a*, 160*b*, and/or 160*c* may be formed between the first insulating layers 116' of the lower insulator stack structure Sta, the intermediate insulator stack structure STb, and/or the upper insulator stack structure STc.

As the first intermediate insulating layer 120', the second intermediate insulating layer 122', and/or the first cover insulating layer 124 are etched in the horizontal direction, fourth recessed holes 162*a*, 162*b*, and/or 162*c* may be formed between the lower insulator stack structure STa and the intermediate insulator stack structure STb, between the intermediate insulator stack structure STb and the upper insulator stack structure STc, and/or between the upper insulator stack structure STc and the first cover insulating layer 124.

Oxide films 112*a* and/or 112*c* constituting the second cover insulating layer 125, the second insulating layers 116, the second intermediate insulating layer 122, the first intermediate insulating layer 120, and/or the first composite film 112 in contact with the first preliminary contact hole 134*r* in FIG. 11 in the first contact area A4U are etched in the horizontal direction (X direction) to form a first contact hole 134.

As the second insulating layers 116 are etched in the horizontal direction, fifth recessed holes 164*a*, 164*b*, and/or 164*c* are formed between the second insulating layers 116 of the lower contact gate stack structure GSa, the intermediate contact gate stack structure GSb, and/or the upper contact gate stack structure GSc.

As the first intermediate insulating layer 120, the second intermediate insulating layer 122, and/or the second cover insulating layer 125 are etched in the horizontal direction (X direction), sixth recessed holes 166*a*, 166*b*, and/or 166*c* may be formed between the lower contact gate stack structure GSa and the intermediate contact gate stack structure GSb, between the intermediate contact gate stack structure GSb and the upper contact gate stack structure GSc, and/or between the upper contact gate stack structure GSc and the second cover insulating layer 125.

As the oxide films 112*a* and/or 112*c* constituting the first composite film 112 in the horizontal direction (X direction) are etched, a seventh recessed hole 167 may be formed between the second composite film 114 and the nitride film 112*b* and between the nitride film 112*b* and the first substrate 110.

Oxide films 112*a* and/or 112*c* constituting the second cover insulating layer 125, the second insulating layers 116, and/or the first composite film 112 in contact with the second preliminary contact hole 136*r* in FIG. 11 in the second contact area A4L are etched in the horizontal direction (X direction) to form the second contact hole 136.

As the second insulating layers 116 are etched in the horizontal direction, an eighth recessed hole 168 may be formed between the second insulating layers 116 of the lower contact gate stack structure GSa. As the oxide films 112*a* and/or 112*c* constituting the first composite film 112 in the horizontal direction are etched, a ninth recessed hole 169 may be formed between the second composite film 114 and the nitride film 112*b* and/or between the nitride film 112*b* and the first substrate 110.

Figure 13:
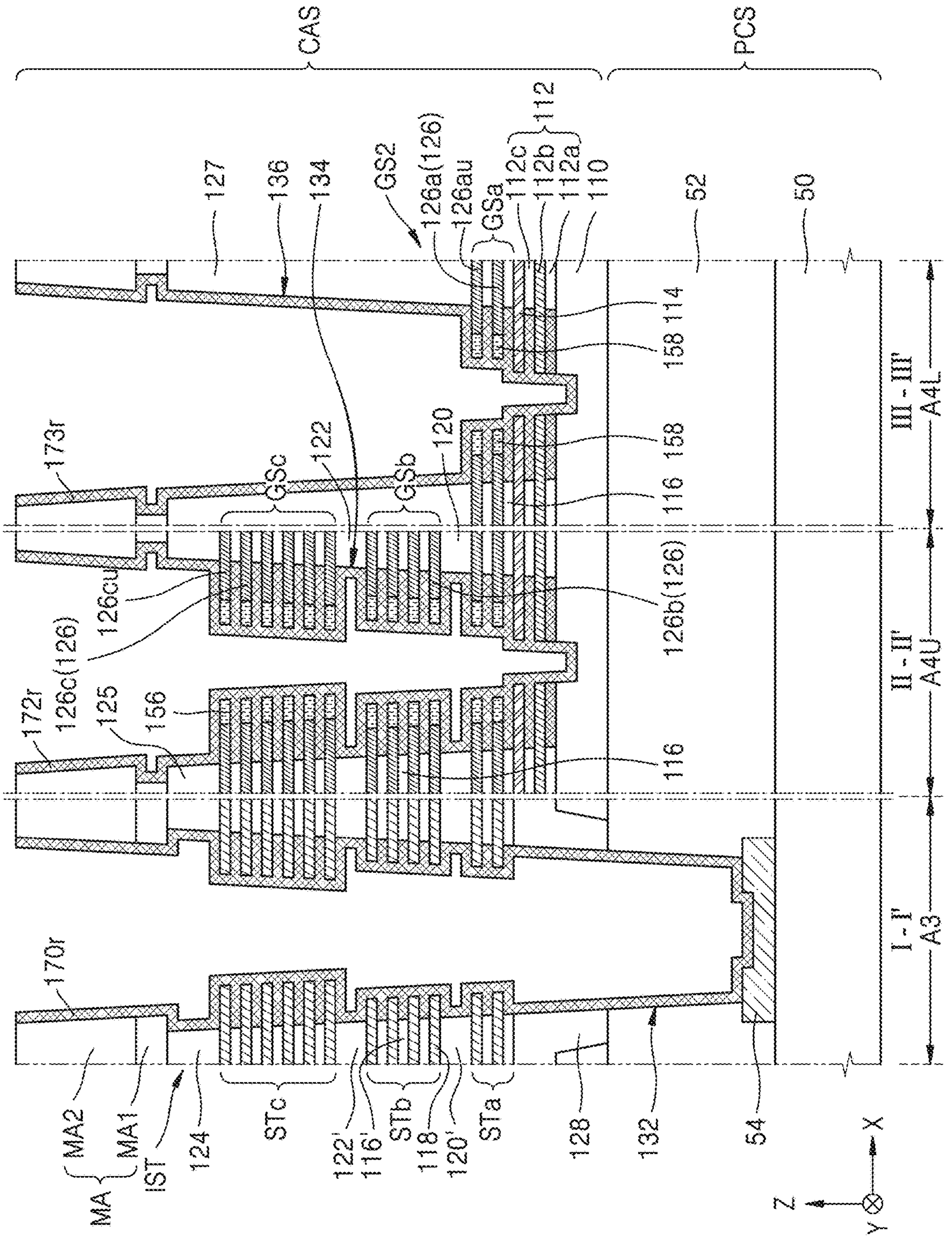

Referring to FIG. 13, a first filling insulating material layer 170*r* is formed on the inner wall of the through hole 132, the inside of the third recessed holes 160*a*, 160*b*, and/or 160*c*, and/or the inside of the fourth recessed holes 162*a*, 162*b*, and/or 162*c* in the through electrode area A3.

A second filling insulating material film 172*r* is formed on the inner wall of the first contact hole 134, the inside of the fifth recessed holes 164*a*, 164*b*, and/or 164*c*, the inside of the sixth recessed holes 166*a*, 166*b*, and/or 166*c*, and/or the inside of the seventh recessed hole 167 In the first contact area A4U.

A third filling insulating material film 173*r* is formed in the inner wall of the second contact hole 136, the inside of the eighth recessed hole 168, and/or the inside of the ninth recessed hole 169 in the second contact area A4L. The first filling insulating material film 170*r*, the second filling insulating material film 172*r*, and/or the third filling insulating material film 173*r* may be simultaneously formed. The first filling insulating material film 170*r*, the second filling insulating material film 172*r*, and/or the third filling insulating material film 173*r* are formed of silicon oxide. The first filling insulating material film 170*r*, the second filling insulating material film 172*r*, and/or the third filling insulating material film 173*r* may be formed to a thickness of several tens of nanometers.

Figure 14:
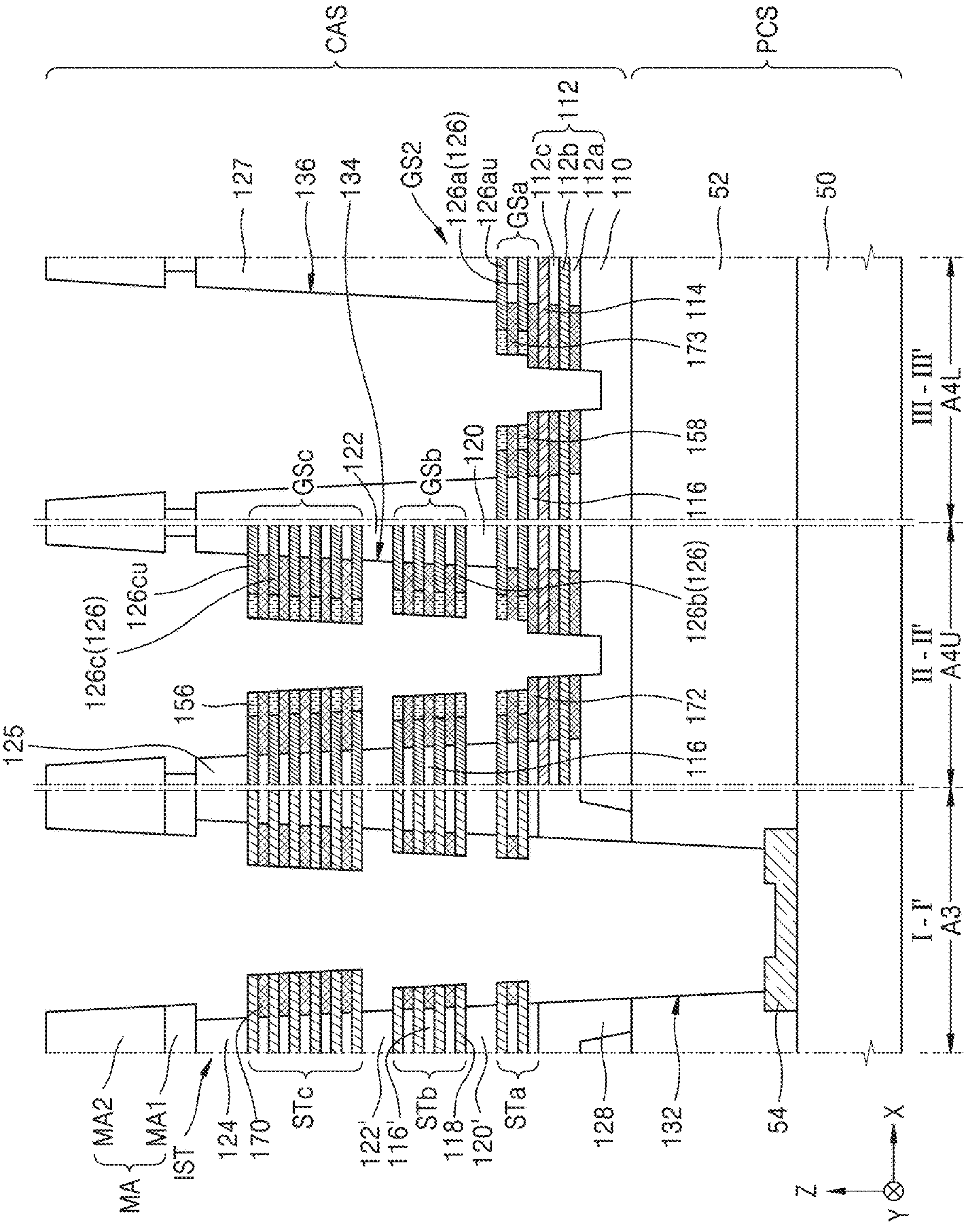

Referring to FIG. 14, the first filling insulating material film 170*r* of FIG. 13 formed on the inner wall of the through hole 132 in the through electrode area A3 is etched. Accordingly, the first filling insulating layer 170 is formed only on the inside of the third recessed holes 160*a*, 160*b*, and/or 160*c* in FIG. 13.

The second filling insulating material film 172*r* of FIG. 13 formed on the inner wall of the first contact hole 134 in the first contact area A4U is etched. Accordingly, the second filling insulating layer 172 is formed inside the fifth recessed holes 164*a*, 164*b*, and/or 164*c* in FIG. 13 and/or inside the seventh recessed hole 167 in FIG. 13.

The third filling insulating material film 173*r* in FIG. 13 formed on the inner wall of the second contact hole 136 in the second contact area A4L is etched. Accordingly, a third filling insulating layer 173 is formed inside the eighth recessed hole 168 in FIG. 13 and/or in the ninth recessed hole 169 in FIG. 13.

The etching processes of the first filling insulating material film 170*r* of FIG. 13, the second filling insulating material film 172*r* of FIG. 13, and/or the third filling insulating material film 173*r* of FIG. 13 may be simultaneously performed. Accordingly, the first filling insulating layer 170, the second filling insulating layer 172, and/or the third filling insulating layer 173 may be simultaneously formed. The first filling insulating layer 170, the second filling insulating layer 172, and/or the third filling insulating layer 173 are formed of silicon oxide.

Figure 15:
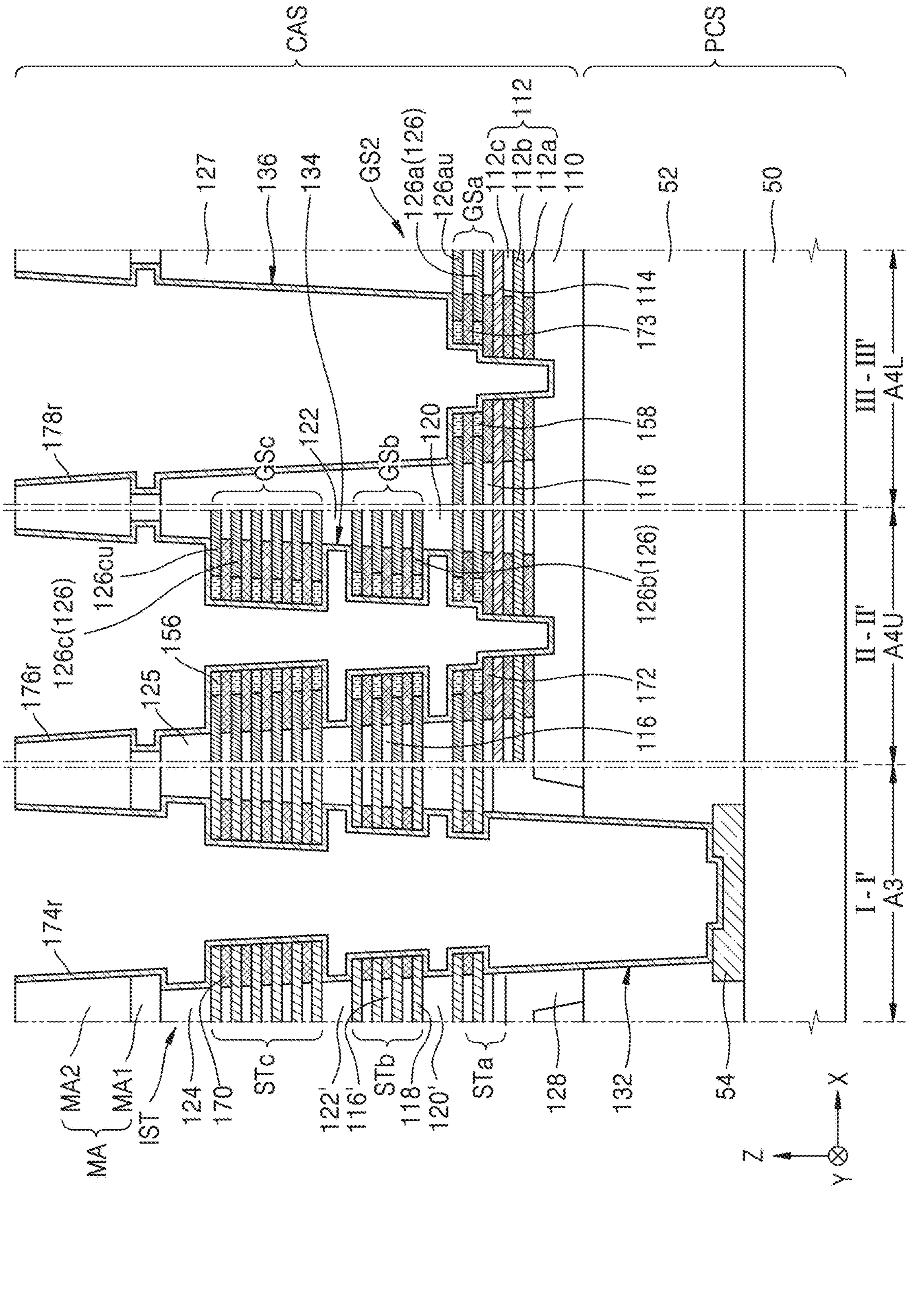

Referring to FIG. 15, a first etching blocking insulating material layer 174*r* is formed on the inner wall of the through hole 132, one side wall of the first intermediate insulating layer 120' and/or the second intermediate insulating layer 122', on one sidewall of the sacrificial films 118 and/or the first filling insulating layer 170, and/or on one sidewall of the first cover insulating layer 124 in the through electrode area A3.

A second etching blocking insulating material film 176*r* is formed on the inner wall of the first contact hole 134, one side wall of the first intermediate insulating layer 120 and/or the second intermediate insulating layer 122, one sidewall of the first separation insulating layer 156 and/or the second filling insulating layer 172, and/or one sidewall of the second cover insulating layer 125 in the first contact area A4U. The second etching blocking insulating material film 176*r* is formed to cover the first uppermost gate line 126*cu* and/or the first separation insulating layer 156 adjacent thereto.

A third etching blocking insulating material film 178*r* is formed on an inner wall of the second contact hole 136, one sidewall of the second separation insulating layer 158 and/or the third filling insulating layer 173, and/or on one sidewall of the third cover insulating layer 127 in the second contact area A4L. The third etching blocking insulating material film 178*r* is formed to cover the second uppermost gate line 126*au* and/or the second separation insulating layer 158 adjacent thereto.

The first etching blocking insulating material film 174*r*, the second etching blocking insulating material film 176*r*, and/or the third etching blocking insulating material film 178*r* may be simultaneously formed. The first etching blocking insulating material film 174*r*, the second etching blocking insulating material film 176*r*, and/or the third etching blocking insulating material film 178*r* are formed of aluminum oxide. The first etching blocking insulating material film 174*r*, the second etching blocking insulating material film 176*r*, and/or the third etching blocking insulating material film 178*r* are formed to a thickness of several nanometers.

Figure 16:
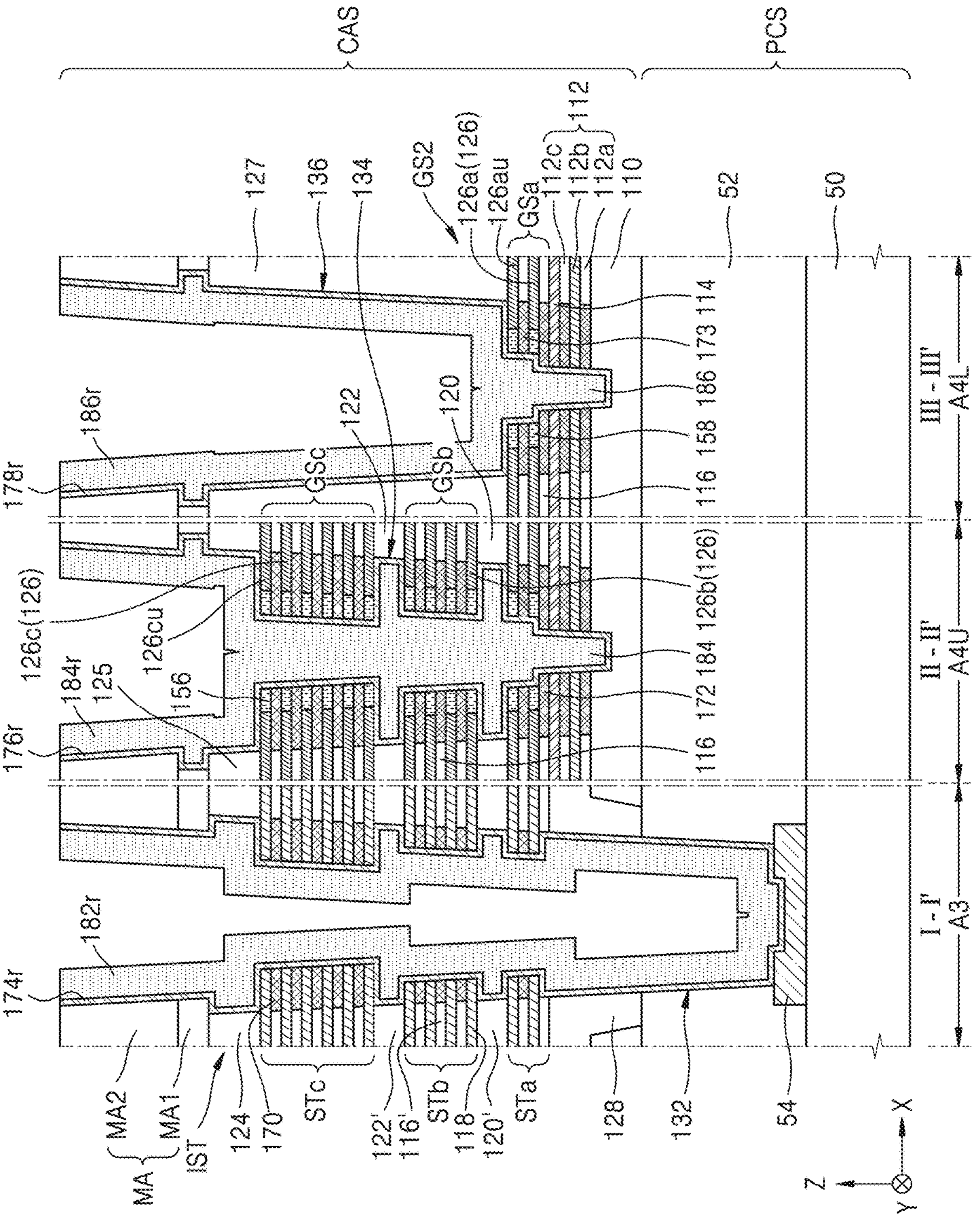

Referring to FIG. 16, a first buried insulating material film 182*r* is formed on the first etching blocking insulating material film 174*r* in the through hole 132 in the through electrode area A3. The first buried insulating material film 182*r* is formed so as not to fill the inside of the through hole 132.

A second buried insulating material film 184*r* is formed on the second etching blocking insulating material film 176*r* in the first contact hole 134 in the first contact area A4U. The second buried insulating material film 184*r* is formed so as not to fill the inside of the first contact hole 134.

A third buried insulating material film 186*r* is formed on the third etching blocking insulating material film 178*r* in the second contact hole 136 in the second contact area A4L. The third buried insulating material film 186*r* is formed so as not to fill the inside of the second contact hole 136.

The first buried insulating material film 182*r*, the second buried insulating material film 184*r*, and/or the third buried insulating material film 186*r* may be simultaneously formed. The first buried insulating material film 182*r*, the second buried insulating material film 184*r*, and/or the third buried insulating material film 186*r* are formed of silicon oxide. The first buried insulating material film 182*r*, the second buried insulating material film 184*r*, and/or the third buried insulating material film 186*r* are formed to a thickness of several tens of nanometers.

Figure 17:
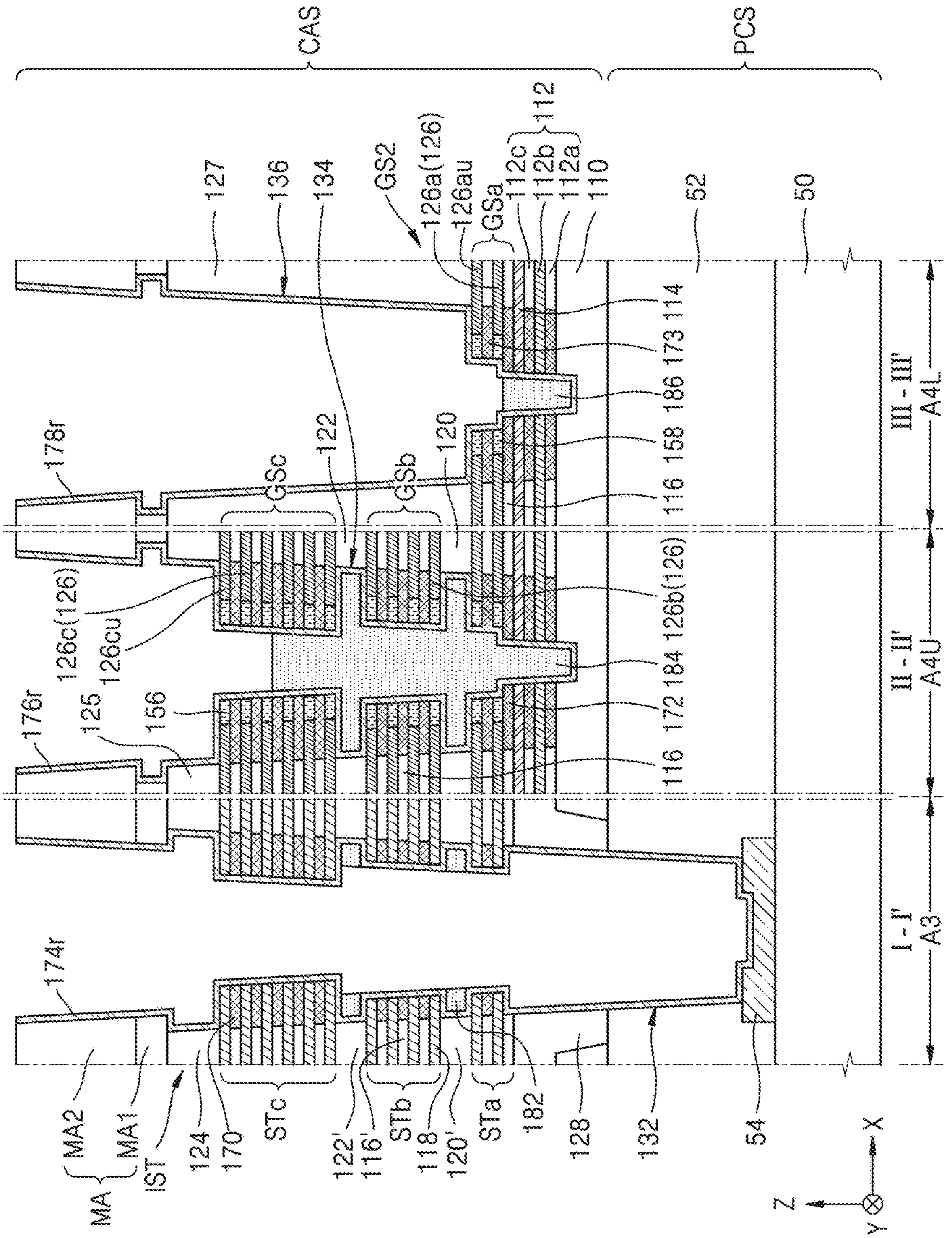

Referring to FIG. 17, the first buried insulating material film 182*r* of FIG. 16 in the through hole 132 in the through electrode area A3 is etched. When the first buried insulating material film 182*r* in FIG. 16 is etched, the first etching blocking insulating material film 174*r* performs an etching blocking role.

The entire first buried insulating material film is etched and removed from the through electrode area A3. However, the first buried insulating layer 182 is formed on the first etching blocking insulating material film 174*r* on one sidewall of the first intermediate insulating layer 120' and the second intermediate insulating layer 122'. The first buried insulating layer 182 may be formed inside the fourth recessed holes 162*a* and/or 162*b* of FIG. 12. The first buried insulating layer 182 is formed of silicon oxide.

A second buried insulating layer 184 is formed by etching the second buried insulating material film 184*r* of FIG. 16 in the first contact hole 134 in the first contact area A4U. When the second buried insulating material film 184*r* in FIG. 16 is etched, the second etching blocking insulating material film 176*r* performs an etching blocking role. The second buried insulating layer 184 is formed of silicon oxide.

The second buried insulating layer 184 is formed to remain inside the first contact hole 134. The upper surface of the second buried insulating layer 184 may be formed to be positioned at the same level as or below the upper surface of the upper contact gate stack structure GSc.

A third buried insulating layer 186 is formed by etching the third buried insulating material film 186*r* of FIG. 16 in the second contact hole 136 in the second contact area A4L. When the third buried insulating material film 186*r* in FIG. 16 is etched, the third etching blocking insulating material film 178*r* performs an etching blocking role. The third buried insulating layer 186 is formed of silicon oxide.

The third buried insulating layer 186 is formed to remain inside the second contact hole 136. The upper surface of the third buried insulating layer 186 may be formed to be positioned at the same level as or below the upper surface of the lower contact gate stack structure GS a.

Figure 18:
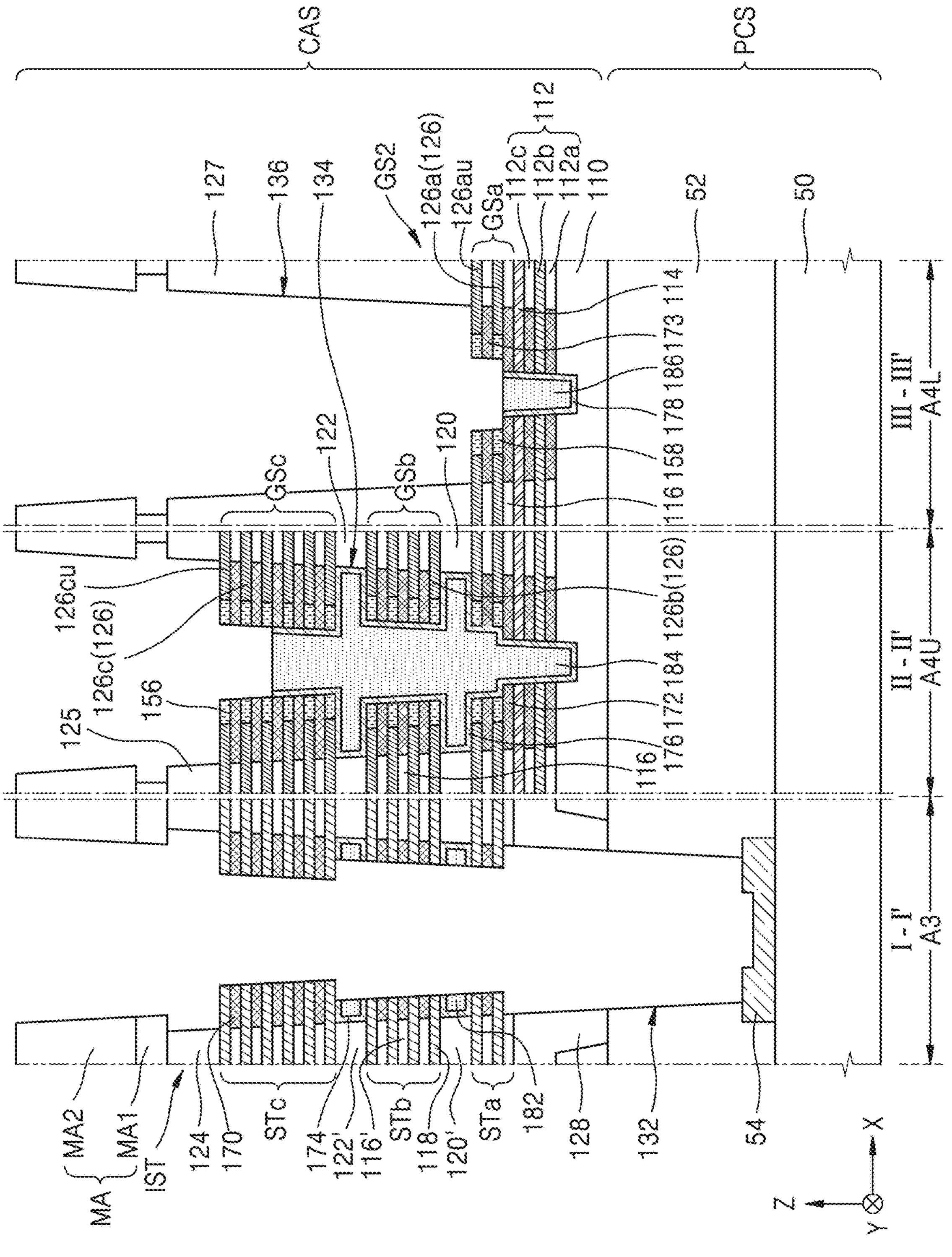

Referring to FIG. 18, the first etching blocking insulating material film 174*r* of FIG. 17 inside the through hole 132 is etched in the through electrode area A3 to form a first etching blocking insulating layer 174. The first etching blocking insulating layer 174 is formed of aluminum oxide.

The first etching blocking insulating layer 174 may be formed between one side wall of the first intermediate insulating layer 120' and the sacrificial films 118 adjacent thereto, and/or between one side wall of the second intermediate insulating layer 122' and the sacrificial films 118 adjacent thereto. The peripheral circuit wiring layer may be exposed by etching of the first etching blocking insulating material film 174*r* of FIG. 17.

In the first contact area A4U, the second etching blocking insulating material film 176*r* of FIG. 17 inside the first contact hole 134 on the second buried insulating layer 184 is etched to form a second etching blocking insulating layer 176. According to the etching of the second etching blocking insulating material film 176*r* of FIG. 17, the first uppermost gate line 126*cu* may be exposed to the outside. The second etching blocking insulating layer 176 is formed of aluminum oxide.

In the second contact area A4L, the third etching blocking insulating material film 178*r* of FIG. 17 inside the second contact hole 136 on the third buried insulating layer 186 is etched to form a third etching blocking insulating layer 178. According to the etching of the third etching blocking insulating material film 178*r* of FIG. 17, the second uppermost gate line 126*au* may be exposed to the outside. The third etching blocking insulating layer 178 is formed of aluminum oxide.

The first etching blocking insulating material film 174*r* in FIG. 17, the second etching blocking insulating material film 176*r* in FIG. 17, and/or the third etching blocking insulating material film 178*r* in FIG. 17 may be simultaneously etched.

Continuingly, referring to FIG. 5, a through electrode 188 electrically connected to the peripheral circuit wiring layer 54 is formed in the through hole 132 in the through electrode area A3.

In the first contact area A4U, the first contact electrode 190 electrically connected to the first uppermost gate line 126*cu* is formed while filling the first contact hole 134 on the second buried insulating layer 184.

In the second contact area A4L, a second contact electrode 192 electrically connected to the second uppermost gate line 126*au* is formed while filling the second contact hole 136 on the third buried insulating layer 186. The through electrode 188, the first contact electrode 190, and/or the second contact electrode 192 may be simultaneously formed.

Figure 19:
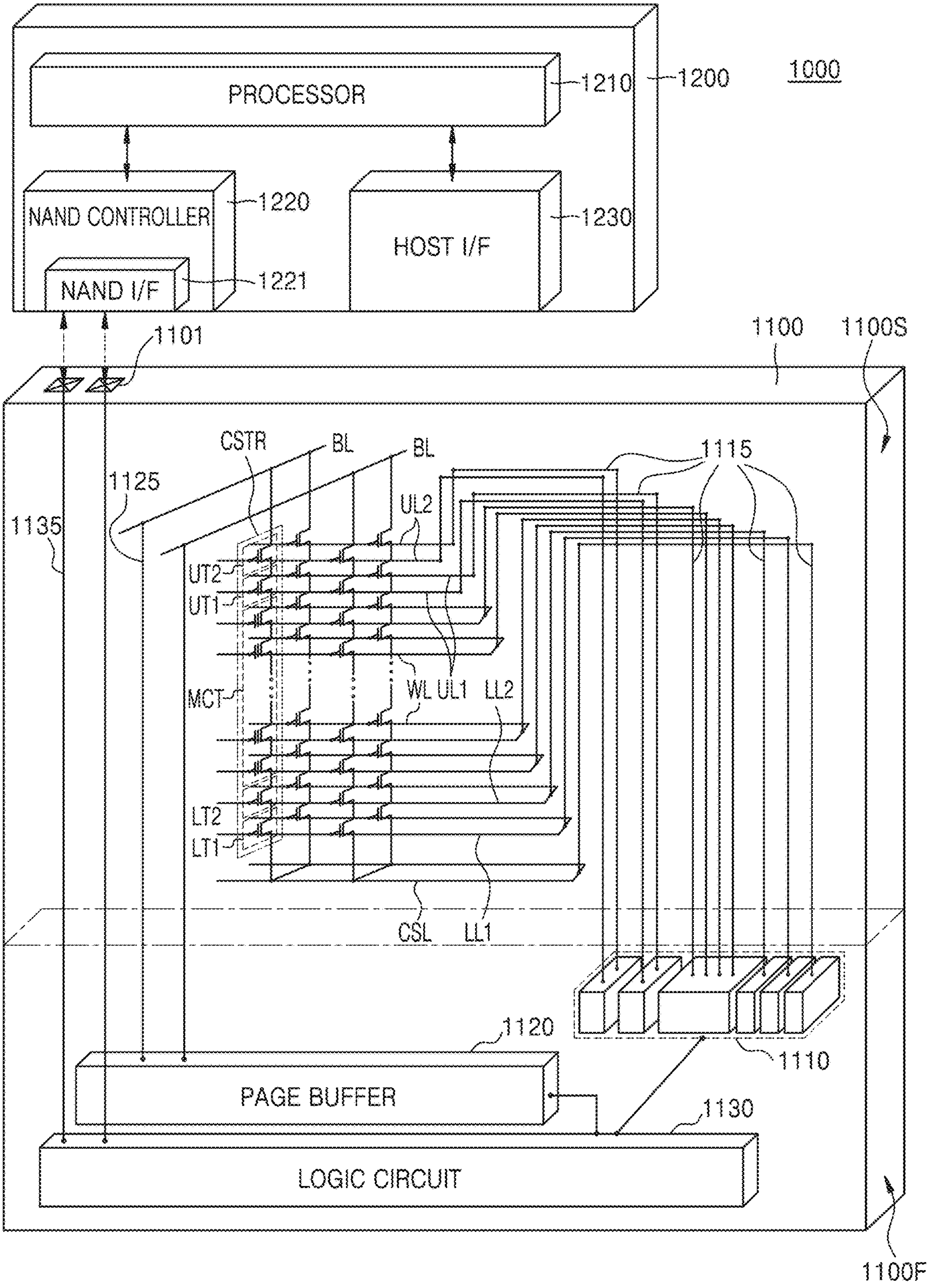
FIG. 19 is a diagram schematically illustrating an electronic system including a vertical non-volatile memory device according to some example embodiments of the inventive concepts.

FIG. 19 is a diagram schematically illustrating an electronic system including a vertical non-volatile memory device according to some example embodiments of the inventive concepts.

In particular, an electronic system 1000 according to some example embodiments of the inventive concepts may include a semiconductor device 1100 and/or a controller 1200 electrically connected to the semiconductor device 1100. The electronic system 1000 may be a storage device including one or a plurality of semiconductor devices 1100 and/or an electronic device including a storage device.

For example, the electronic system 1000 may be a solid state drive device (SSD), a universal serial bus (USB), a computing system, a medical device, and/or a communication device including at least one semiconductor device 1100.

The semiconductor device 1100 may be a non-volatile memory device. For example, the semiconductor device 1100 may be a NAND flash memory device that is the vertical non-volatile memory device described above.

The semiconductor device 1100 may include a first structure 1100F and/or a second structure 1100S on the first structure 1100F. In some example embodiments, the first structure 1100F may be positioned next to the second structure 1100S. The first structure 1100F may be a peripheral circuit structure including a decoder circuit 1110, a page buffer 1120, and/or a logic circuit 1130.

The second structure 1100S may be a memory cell structure including a bit line BL, a common source line CSL, a plurality of word lines WL, first and/or second gate upper lines UL1 and UL2, first and/or second gate lower lines LL1 and LL2, and/or a plurality of memory cell strings CSTR between the bit line BL and the common source line CSL.

In the second structure 1100S, each or one or more of the plurality of memory cell strings CSTR may include lower transistors LT1 and/or LT2 adjacent to the common source line CSL, upper transistors UT1 and/or UT2 adjacent to the bit line BL, and/or a plurality of memory cell transistors MCT positioned between the lower transistors LT1 and/or LT2 and the upper transistors UT1 and/or UT2. The number of lower transistors LT1 and/or LT2 and/or the number of upper transistors UT1 and/or UT2 may be variously modified according to some example embodiments.

In some example embodiments, the upper transistors UT1 and/or UT2 may include a string select transistor, and the lower transistors LT1 and/or LT2 may include a ground select transistor. The plurality of gate lower lines LL1 and/or LL2 may be gate electrodes of the lower transistors LT1 and/or LT2, respectively. The word line WL may be a gate electrode of the memory cell transistor MCT, and/or the gate upper lines UL1 and/or UL2 may be gate electrodes of the upper transistors UT1 and/or UT2.

The common source line CSL, the plurality of gate lower lines LL1 and/or LL2, the plurality of word lines WL, and/or the plurality of gate upper lines UL1 and/or UL2 may be electrically connected to the decoder circuit 1110 through a plurality of first connection wires 1115 extending from the first structure 1100F to the second structure 1100S. The plurality of bit lines BL may be electrically connected to the page buffer 1120 through a plurality of second connection wires 1125 extending from the first structure 1100F to the second structure 1100S.

In the first structure 1100F, the decoder circuit 1110 and/or the page buffer 1120 may perform a control operation on at least one of the plurality of memory cell transistors MCT. The decoder circuit 1110 and/or the page buffer 1120 may be controlled by the logic circuit 1130.

The semiconductor device 1100 may communicate with the controller 1200 through the I/O pad 1101 electrically connected to the logic circuit 1130. The I/O pad 1101 may be electrically connected to the logic circuit 1130 through an I/O connection wire 1135 extending from the first structure 1100F to the second structure 1100S.

The memory controller 1200 may include a processor 1210, a NAND controller 1220, and/or a host interface 1230. In some example embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a preset firmware, and may access the semiconductor device 1100 by controlling the NAND controller 1220.

The NAND controller 1220 may include a NAND I/F 1221 that processes communication with the semiconductor device 1100. Through the NAND interface 1221, a control command for controlling the semiconductor device 1100, data to be written to the plurality of memory cell transistors MCT of the semiconductor device 1100, and/or data to be read from the plurality of memory cell transistors MCT of the semiconductor device 1100 may be transmitted. The host interface 1230 may provide a communication function between the electronic system 1000 and an external host. When receiving a control command from an external host through the host interface 1230, the processor 1210 may control the semiconductor device 1100 in response to the control command.

Figure 20:
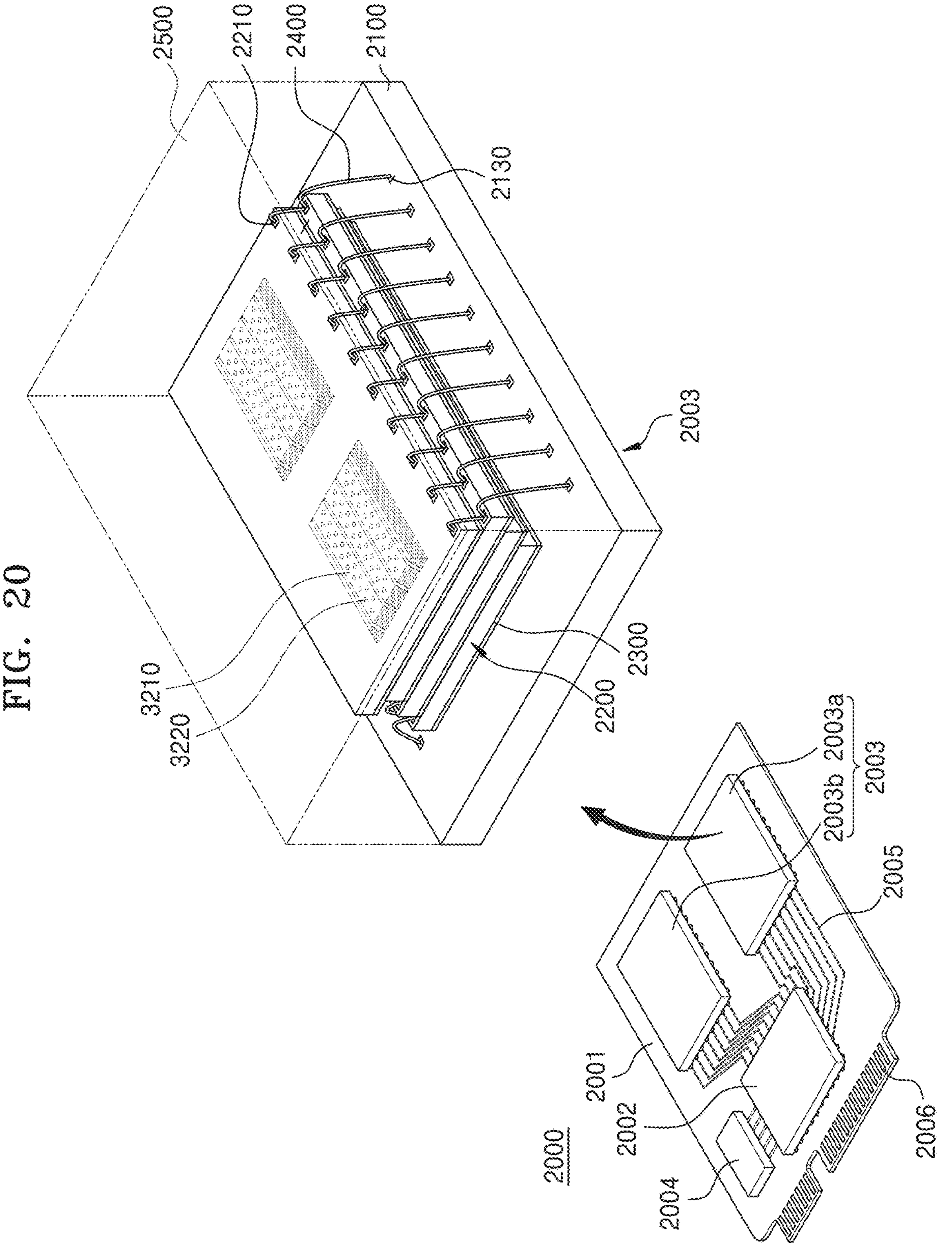
FIG. 20 is a perspective view schematically illustrating an electronic system including a vertical non-volatile memory device according to some example embodiments of the inventive concepts.

FIG. 20 is a perspective view schematically illustrating an electronic system including a vertical non-volatile memory device according to some example embodiments of the inventive concepts.

In particular, an electronic system 2000 according to some example embodiments of the inventive concepts may include a main board 2001, a controller 2002 mounted on the main board 2001, one or more semiconductor packages 2003, and/or a dynamic random access memory (DRAM) 2004. The semiconductor package 2003 and/or the DRAM 2004 may be connected to the controller 2002 by a plurality of wire patterns 2005 formed on the main board 2001.

The main board 2001 may include a connector 2006 including a plurality of pins coupled to an external host. The number and arrangement of the plurality of pins in the connector 2006 may vary according to a communication interface between the electronic system 2000 and the external host. In some example embodiments, the electronic system 2000 may communicate with an external host according to any one of the interfaces such as Universal Serial Bus (USB), Peripheral Component Interconnect Express (PCI-Express), Serial Advanced Technology Attachment (SATA), and/or M-Phy for Universal Flash Storage (UFS).

In some example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to and/or read data from the semiconductor package 2003, and may improve the operating speed of the electronic system 2000.

The DRAM 2004 may be a buffer memory for reducing a speed difference between the semiconductor package 2003, that is, a data storage space, and an external host. The DRAM 2004 included in the electronic system 2000 may operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and/or second semiconductor packages 2003*a* and 2003*b* spaced apart from each other. Each or one or more of the first and/or second semiconductor packages 2003*a* and 2003*b* may be a semiconductor package including a plurality of semiconductor chips 2200.

Each or one or more of the first and/or second semiconductor packages 2003*a* and 2003*b* may include a package substrate 2100, a plurality of semiconductor chips 2200 on the package substrate 2100, an adhesive layer 2300 positioned on a lower surface of each or one or more of the plurality of semiconductor chips 2200, a connection structure 2400 electrically connecting the plurality of semiconductor chips 2200 and the package substrate 2100, and/or a molding layer 2500 covering the plurality of semiconductor chips 2200 and/or the connection structure 2400 on the package substrate 2100.

The package substrate 2100 may be a printed circuit board including a plurality of package upper pads 2130. Each or one or more of the plurality of semiconductor chips 2200 may include an I/O pad 2210. Each or one or more of the plurality of semiconductor chips 2200 may include a plurality of gate stacks 3210 and a plurality of channel structures 3220. Each or one or more of the plurality of semiconductor chips 2200 may include the vertical non-volatile memory device described above.

In some example embodiments, the connection structure 2400 may be a bonding wire electrically connecting the I/O pad 2210 and the package upper pad 2130. Accordingly, in the first and/or second semiconductor packages 2003*a* and 2003*b*, the plurality of semiconductor chips 2200 may be electrically connected to each other by a bonding wire method, and may be electrically connected to the package upper pad 2130 of the package substrate 2100.

According to some example embodiments, in relation to the first and/or second semiconductor packages 2003*a* and 2003*b*, the plurality of semiconductor chips 2200 may be electrically connected to each other by a connection structure including a through silicon via (TSV) instead of the bonding wire type connection structure 2400.

In some example embodiments, the controller 2002 and the plurality of semiconductor chips 2200 may be included in one package. In some example embodiments, the controller 2002 and the plurality of semiconductor chips 2200 may be mounted on a separate interposer substrate different from the main board 2001, and the controller 2002 and the plurality of semiconductor chips 2200 may be connected to each other by wires formed on the interposer substrate.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A vertical non-volatile memory device comprising:

a substrate;

a contact gate stack structure including a plurality of gate lines stacked in a vertical direction on the substrate, the vertical direction being perpendicular to a surface of the substrate;

a plurality of insulating layers between the gate lines;

a plurality of separation insulating layers in direct contact with a protruding end of each of the plurality of gate lines comprising an uppermost gate line, respectively, in a horizontal direction at two sides of a contact hole, wherein the contact hole extends in the vertical direction in the contact gate stack structure so that the protruding ends of the plurality of gate lines protrude from an inner wall of the contact hole, the horizontal direction being horizontal to the surface of the substrate; and a contact electrode at the contact hole and electrically connected to the uppermost gate line among the plurality of gate lines, the contact electrode comprising a bottom surface that is lower than the uppermost gate line relative to the substrate, the contact electrode surrounding and contacting at least a side surface and a top surface of the uppermost gate line.

2. The vertical non-volatile memory device of claim 1, wherein the contact electrode is electrically separated from the plurality of gate lines other than the uppermost gate line by the separation insulating layers in the horizontal direction.

3. The vertical non-volatile memory device of claim 1, further comprising:

a plurality of filling insulating layers between the separation insulating layers and the insulating layers in the horizontal direction inside the contact hole.

4. The vertical non-volatile memory device of claim 1, wherein the substrate defines a portion of a bottom of the contact hole.

5. The vertical non-volatile memory device of claim 1, further comprising:

a buried insulating layer in the contact hole, wherein the contact electrode is on the buried insulating layer.

6. The vertical non-volatile memory device of claim 1, further comprising:

an etching blocking insulating layer on one side of the separation insulating layers and a portion of a bottom of the contact hole.

7. The vertical non-volatile memory device of claim 1, wherein the contact electrode is below an upper surface of the contact gate stack structure in the contact hole.

8. The vertical non-volatile memory device of claim 1, wherein the contact gate stack structure comprises:

a lower contact gate stack structure, an intermediate contact gate stack structure, and an upper contact gate stack structure sequentially stacked on the substrate; and a first intermediate insulating layer and a second intermediate insulating layer between the lower contact gate stack structure and the intermediate contact gate stack structure, and between the intermediate contact gate stack structure and the upper contact gate stack structure, respectively, wherein the first intermediate insulating layer and the second intermediate insulating layer are thicker than the insulating layers.

9. The vertical non-volatile memory device of claim 1, further comprising:

a plurality of composite films between the substrate and the plurality of gate lines on the substrate.

10. A vertical non-volatile memory device comprising:

a memory cell area including memory cells on a substrate;

a connection area at one side of the memory cell area in a horizontal direction and electrically connected to the memory cell area, the horizontal direction being horizontal to a surface of the substrate, wherein the connection area includes, a contact gate stack structure including a plurality of gate lines stacked in a vertical direction on the substrate and a plurality of insulating layers between the gate lines, the vertical direction being perpendicular to the surface of the substrate, a plurality of separation insulating layers in direct contact with a protruding end of each of the plurality of gate lines comprising an uppermost gate line, respectively, in the horizontal direction at two sides of a contact hole, wherein the contact hole extends in the vertical direction in the contact gate stack structure so that the protruding ends of the plurality of gate lines protrude from an inner wall of the contact hole;

a buried insulating layer buried in the contact hole; and a contact electrode on the buried insulating layer and the contact hole and electrically connected to the uppermost gate line among the plurality of gate lines, the contact electrode comprising a bottom surface that is lower than the uppermost gate line relative to the substrate, the contact electrode surrounding and contacting at least a side surface and a top surface of the uppermost gate line.

11. The vertical non-volatile memory device of claim 10, wherein the contact gate stack structure includes a plurality of contact gate stack structures in a step area in the horizontal direction from the memory cell area, and the plurality of contact gate stack structures includes the separation insulating layers and the contact electrode.

12. The vertical non-volatile memory device of claim 10, wherein the contact gate stack structure comprises:

a lower contact gate stack structure on the substrate; and a cover insulating layer on the lower contact gate stack structure.

13. The vertical non-volatile memory device of claim 10, wherein the buried insulating layer is partially buried in the contact hole, and the contact electrode is on the buried insulating layer buried partially.

14. The vertical non-volatile memory device of claim 10, further comprising:

a plurality of filling insulating layers between the separation insulating layers and the insulating layers in the horizontal direction inside the contact hole; and an etching blocking insulating layer in contact with the buried insulating layer on one side of the separation insulating layers and the filling insulating layers, and on a bottom part of the contact hole.

15. A vertical non-volatile memory device comprising:

a memory cell area including memory cells on a first substrate;

a through electrode area at one side of the memory cell area in a horizontal direction and electrically connected to a peripheral circuit wiring layer of a second substrate below the first substrate, the horizontal direction being horizontal to a surface of the first substrate; and a contact area at one side of a through electrode in the horizontal direction and electrically connected to the memory cell area, wherein the through electrode area includes, an insulator stack structure including a through insulating layer penetrating the first substrate, a plurality of sacrificial films stacked in a vertical direction on the through insulating layer, and a plurality of first insulating layers between the sacrificial films, and a through hole extending in the vertical direction from the peripheral circuit wiring layer of the second substrate inside the insulator stack structure and exposing the peripheral circuit wiring layer and a through electrode buried in the through hole, wherein the contact area includes, a contact gate stack structure including a plurality of gate lines stacked in the vertical direction on the first substrate and a plurality of second insulating layers between the gate lines, the vertical direction being perpendicular to the surface of the first substrate, a plurality of separation insulating layers in contact with a protruding end of each of the plurality of gate lines, respectively, in the horizontal direction at both sides of a contact hole, wherein the contact hole extends in the vertical direction in the contact gate stack structure so that the protruding ends of the plurality of gate lines protrude from an inner wall of the contact hole, a buried insulating layer buried in the contact hole, and a contact electrode on the buried insulating layer and the contact hole and electrically connected to an uppermost gate line among the plurality of gate lines.

16. The vertical non-volatile memory device of claim 15, wherein the sacrificial films of the through electrode area are at a same level as the plurality of gate lines of the contact area.

17. The vertical non-volatile memory device of claim 15, wherein the first insulating layers of the through electrode area are at a same level as the second insulating layers of the contact area.

18. The vertical non-volatile memory device of claim 15, further comprising:

a plurality of first filling insulating layers between protruding portions of the sacrificial films in the through hole, the protruding portions of the sacrificial films protruding from an inner wall of the through hole.

19. The vertical non-volatile memory device of claim 15, wherein the contact area comprises:

a plurality of contact gate stack structures in a step area in the horizontal direction from the memory cell area, wherein the plurality of contact gate stack structures includes the separation insulating layers and the contact electrode.

20. The vertical non-volatile memory device of claim 15, further comprising:

a plurality of second filling insulating layers between the separation insulating layers and the second insulating layers in the horizontal direction inside the contact hole, and an etching blocking insulating layer in contact with the buried insulating layer on one side of the separation insulating layers and the second filling insulating layers, and on a bottom portion of the contact hole.

* * * * *